United States Patent
Kuwata et al.

[11] Patent Number: 5,808,571
[45] Date of Patent: Sep. 15, 1998

[54] SYNCHRONIZATION CONTROL UNIT WHICH MAINTAINS SYNCHRONIZATION BETWEEN SERIAL-TO-PARALLEL CONVERTERS OPERATING IN PARALLEL, OR BETWEEN PARALLEL-TO-SERIAL CONVERTERS OPERATING IN PARALLEL

[75] Inventors: Naoki Kuwata, Kawasaki; Tetsuji Sato, Yokohama; Noriaki Mizuguchi, Sapporo; Tetsuya Kiyonaga, Kawasaki, all of Japan

[73] Assignee: Fujitsu Limited, Kawasaki, Japan

[21] Appl. No.: 789,186

[22] Filed: Jan. 24, 1997

[30] Foreign Application Priority Data

Mar. 8, 1996 [JP] Japan ................................ 8-051142

[51] Int. Cl.$^6$ ................................................ H03M 9/00
[52] U.S. Cl. ........................................ 341/100; 341/101
[58] Field of Search ................................ 341/100, 101, 341/94; 348/525

[56] References Cited

U.S. PATENT DOCUMENTS 5,442,405  8/1995  Taniguchi et al. ...................... 348/525

*Primary Examiner*—Brian K. Young
*Attorney, Agent, or Firm*—Staas & Halsey

[57] ABSTRACT

A synchronization control unit for synchronizing serial-to-parallel (S/P) converters operating in parallel, or parallel-to-serial (P/S) converters operating in parallel. More specifically, first and serial-to-parallel (S/P) converters produce respectively corresponding first and second clock signals and operate in parallel. The first and second clock signals are in synchronization, and a synchronization failure occurs when the first and second clock signals fall out of synchronization. When a synchronization failure occurs, the synchronization control unit resets one of the first and second clock signals so that synchronization between the first and second clock signals is restored within a definite time period. Moreover, the synchronization control unit can perform the same operation with parallel-to-serial (P/S) converters, instead of with S/P converters.

26 Claims, 17 Drawing Sheets

SYNCHRONIZATION CONTROL UNIT WHICH MAINTAINS SYNCHRONIZATION BETWEEN SERIAL-TO-PARALLEL CONVERTERS OPERATING IN PARALLEL, OR BETWEEN PARALLEL-TO-SERIAL CONVERTERS OPERATING IN PARALLEL

CROSS-REFERENCE TO RELATED APPLICATIONS

This application is based on, and claims priority to, Japanese patent application number 08-051142, filed on Mar. 8, 1996, in Japan, and which is incorporated herein by reference.

BACKGROUND OF THE INVENTION

1. Field of the Invention

The present invention relates to a synchronization control unit which maintains synchronization between serial-to-parallel converters operating in parallel, or between parallel-to-serial converters operating in parallel.

2. Description of the Related Art

Data transfer speeds of optical communication systems have been increasing to meet the demand for high-volume data transfer. For example, optical communication systems can provide transmission rates much greater than 1 Gbps.

However, it is very difficult to process data travelling at such high transmission rates. More specifically, data processing circuits used in the optical communication system are not as fast as the transmission signals travelling in the optical communication system.

To compensate for this gap, high rate serial data signals are converted into reduced rate parallel signals by a serial-to-parallel (S/P) converter. The parallel signals are processed, and then reconverted back into a serial signal by a parallel-to-serial (P/S) converter, to regain the original signal rate. The reconverted signals are then transmitted through an optical fiber transmission line.

The P/S converters and S/P converters are typically provided as separate IC chips, and synchronization must be maintained between the individual converters. Therefore, to provide synchronization, S/P converters and P/S converters typically include clock dividers for receiving a main clock signal and producing a divided clock signal from the main clock signal. The clock dividers are adjusted so that the divided clock signals are in phase (and thereby being "synchronized") with each other. However, it is difficult to maintain synchronization between the individual converters. For example, the initial state of the various converters may differ from each other. Therefore, phase synchronization of divided clock signals can not be achieved by simply distributing the same clock signal to individual converters.

Various methods have been developed to maintain phase synchronization between individual converters. For example, instead of producing a clock divider in each individual converter, a special IC chip dedicated to clock division can supply a divided clock signal to the individual converters. However, this method requires the development and use of a special IC chip dedicated to clock division, thereby increasing the number and cost of IC products. Moreover, additional wiring is necessary to interconnect the various chips together.

In another method to provide phase synchronization between individual converters, one converter can serve as a master chip which provides the other converters, or slave converters, with a divided clock signal. However, this method requires the development of master and slave converters, thereby increasing the number and cost of IC products. It may be possible to solve these problems by developing a combined chip that can work as a master converter as well as serving as a slave converter. However, circuit design of such a chip will be undesireably complex.

In an additional method to provide phase synchronization between individual converters, each converter has its own internal clock divider and each converter is a separate chip from the other converters. All the clock dividers are simultaneously released from a reset state to make their outputs in phase with each other. See, for example, Miyagawa et al, "High Speed Multiplexer/Demultiplexer Module," Proceedings of the 1991 IECICE Fall Conference, B-660, Institute of Electronics, Information and Communication Engineers, 1991. However, with this method, the reset operation is directed to all the clock dividers, and may adversely affect phase-locked loop (PLL) circuits which may be incorporated into the converters.

In another method to provide phase synchronization, each individual converters has its own clock divider and operating clock signal. The clock divider and operating clock signal of each converter is asynchronous with respect to the clock divider and operating clock signal of the other converters. Skew is detected in the divided clock signals generated by the converters, thereby indicating a failed clock divider. The failed clock divider is temporarily reset with an asynchronous reset operation, and sometimes repetitively, until it regains synchronization.

However, with an asynchronous reset operation, it cannot be guaranteed that the clock dividers will be in phase after a single reset operation. Therefore, after the reset operation is performed, another reset operation will be performed if the clock dividers are still out of phase. With each successive reset operation, the probability increases that the clock dividers will be in phase.

For example, assume that two P/S converters operating in parallel each have a 2:1 clock divider which produces a divided clock signal, and the divided clock signals are out of phase. When the operating clocks and the reset operation are completely asynchronous, a reset signal will come at random timing from a clock divider's viewpoint. Therefore, the first attempt of resetting will yield a 50% probability of successful synchronization. The second attempt will increase the probability up to 75%. Moreover, each successive reset attempt will further increase the probability of success.

However, this method will not provide synchronization within a definite time period. More specifically, the method has a non-deterministic nature, where it is uncertain whether synchronization can be established within a prescribed time period. Thus, a single reset operation cannot guarantee that the clock dividers will be synchronized.

SUMMARY OF THE INVENTION

Accordingly, it is an object of the present invention to provide an apparatus which maintains synchronization between serial-to-parallel converters operating in parallel, and between parallel-to-serial converters operating in parallel, and which allows the converters to promptly and definitely regain synchronization with a single reset operation after a synchronization failure.

It is a further object of the present invention to provide an apparatus which maintains synchronization between serial-to-parallel converters operating in parallel, and between parallel-to-serial converters operating in parallel and, during a process to regain synchronization, does not harm phase-locked loop circuits used with the converters.

Additional objects and advantages of the invention will be set forth in part in the description which follows, and, in part, will be obvious from the description, or may be learned by practice of the invention.

The above objects of the present invention are achieved by providing an apparatus which includes first and second serial-to-parallel (S/P) converters, and a synchronization control unit. The first and second S/P converters produce respectively corresponding first and second clock signals and operate in parallel. The first and second clock signals are in synchronization, and a synchronization failure occurs when the first and second clock signals fall out of synchronization. When a synchronization failure occurs, the synchronization control unit resets one of the first and second clock signals, with resetting both of the first and second clock signals, so that synchronization between the first and second clock signals is restored within a definite time period. Moreover, the apparatus can include parallel-to-serial (P/S) converters instead of S/P converters.

In addition, objects of the present invention are achieved by providing first and second serial-to-parallel (S/P) converters, and a synchronization control unit. The first and second S/P converters produce respectively corresponding first and second divided clock signals of, and in synchronization with, a main clock signal of a plurality of pulses. The first and second divided clock signals are thereby in synchronization with each other and a synchronization failure occurs when the first and second divided clock signals fall out of synchronization due to an error in the second S/P converter. When a synchronization failure occurs, the synchronization control unit causes the second divided clock signal to be maintained at a constant level for a fixed period of time and, after the fixed period of time, to be synchronized with the main clock signal beginning with an edge of a first pulse of the main clock signal occurring after the fixed period of time. Moreover, the apparatus can include parallel-to-serial (P/S) converters instead of S/P converters.

BRIEF DESCRIPTION OF THE DRAWINGS

These and other objects and advantages of the invention will become apparent and more readily appreciated from the following description of the preferred embodiments, taken in conjunction with the accompanying drawings of which.

DESCRIPTION OF THE PREFERRED EMBODIMENTS

Figure 1:
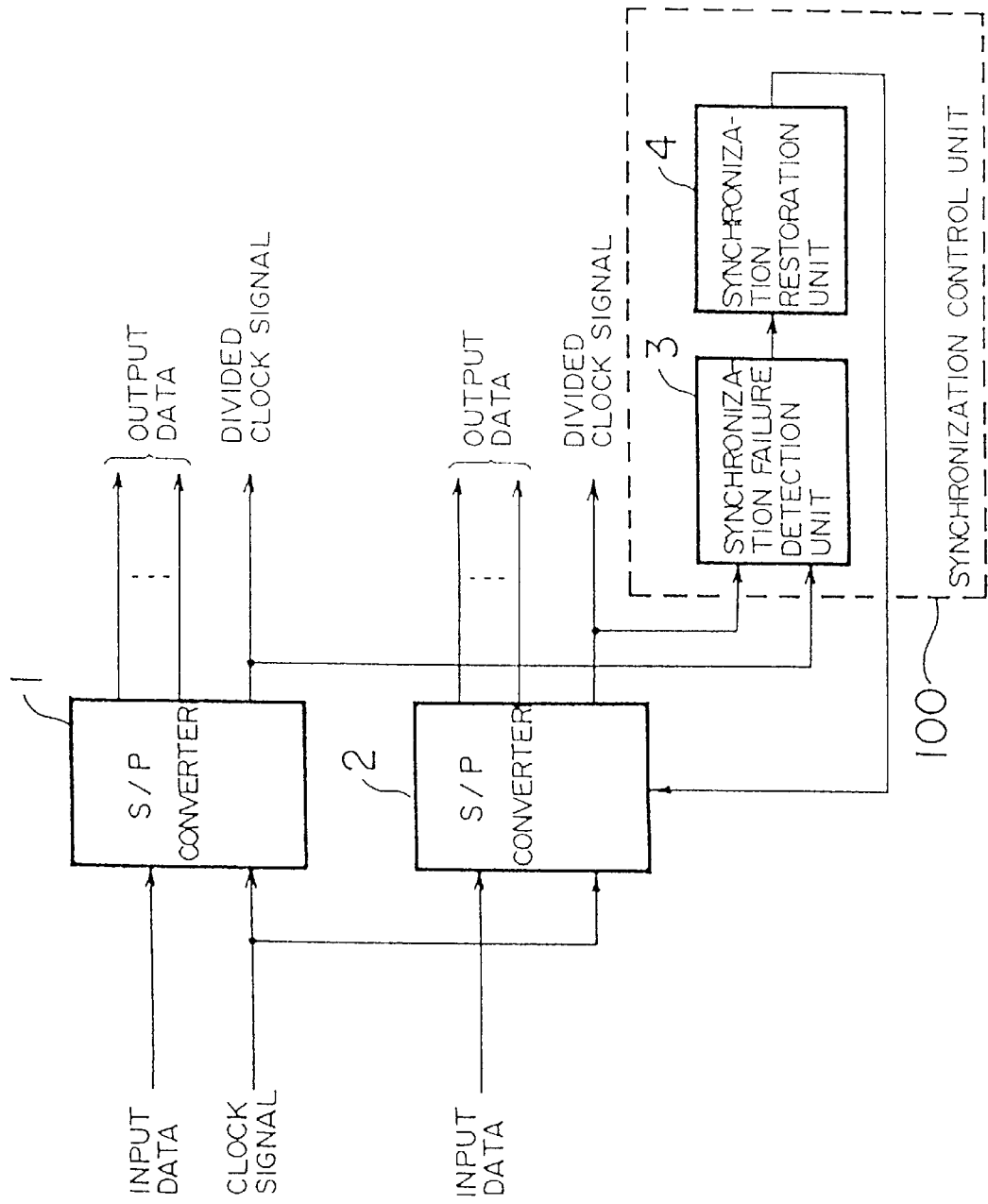
FIG. 1 is a diagram of an apparatus for maintaining synchronization between serial-to-parallel converters operating in parallel, according to an embodiment of the present invention.

Reference will now be made in detail to the present preferred embodiments of the present invention, examples of which are illustrated in the accompanying drawings, wherein like reference numerals refer to like elements throughout.

FIG. 1 is a diagram of an apparatus for maintaining synchronization between serial-to-parallel converters operating in parallel, according to an embodiment of the present invention. Referring now to FIG. 1, serial-to-parallel (S/P) converters 1 and 2 operate in parallel. Each S/P converter 1 and 2 receives serial input data and a clock signal, and produces parallel output data and a divided clock signal. The divided clock signal is a divided clock signal of the received clock signal.

A synchronization failure detection unit 3 detects synchronization failures between S/P converters 1 and 2. A synchronization restoration unit 4 causes S/P converters 1 and 2 to regain synchronization when synchronization failure detection unit 3 detects a synchronization failure. Therefore, synchronization failure detection unit 3 and synchronization restoration unit 4 together form a synchronization control unit 100 for maintaining synchronization between S/P converters 1 and 2.

Figure 2:
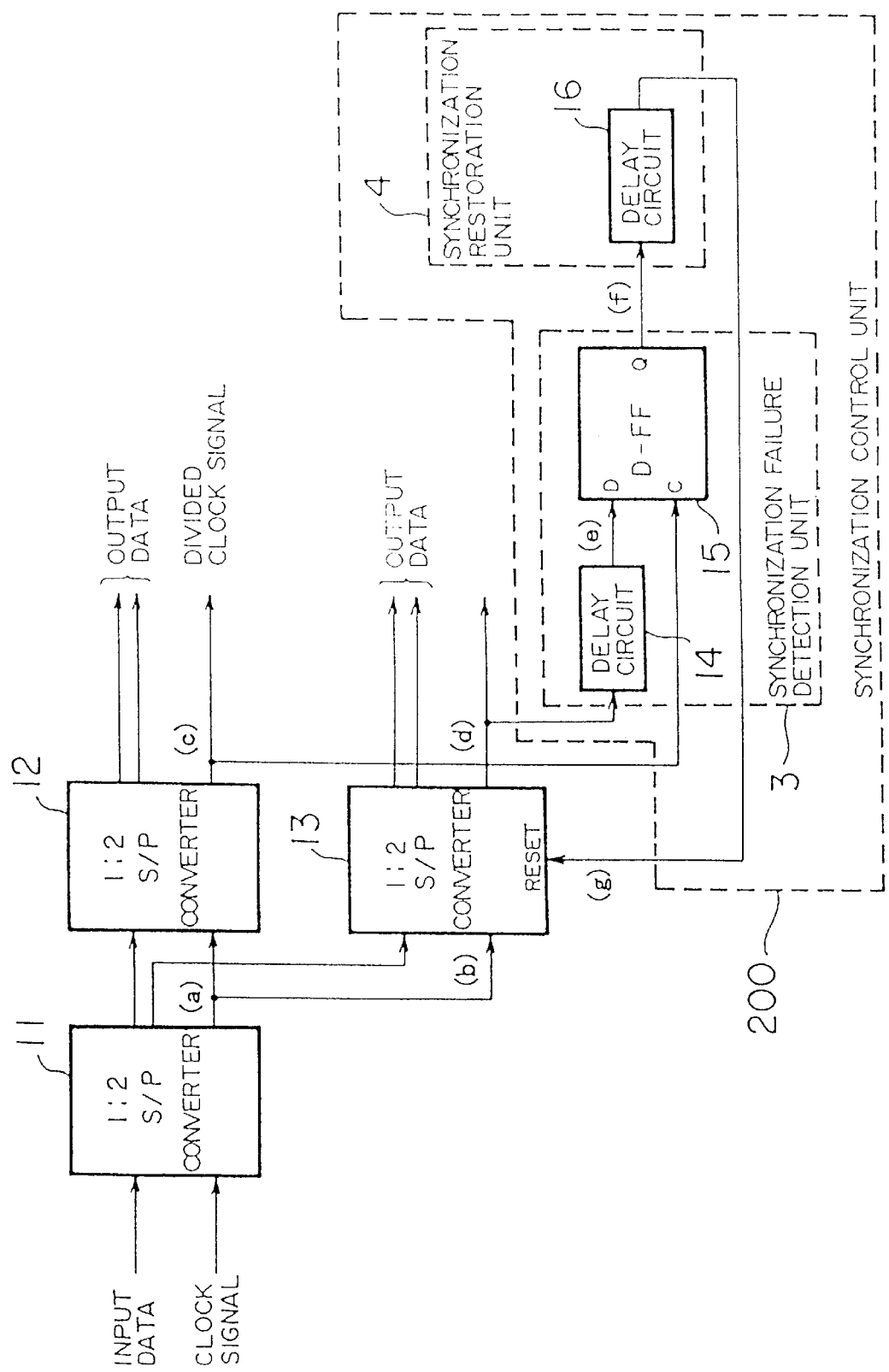
FIG. 2 is a diagram of an apparatus for maintaining synchronization between serial-to-parallel converters operating in parallel, according to an embodiment of the present invention.

FIG. 2 is a diagram of an apparatus for maintaining synchronization between serial-to-parallel converters operating in parallel, according to an additional embodiment of the present invention. Referring now to FIG. 2, each of three S/P converters 11, 12 and 13 performs 1:2 serial-to-parallel conversion, where a serial input data stream (input data) is reformed into a double wide parallel data stream (output data) at a rate which is one-half the rate of the input data stream. S/P converters 12 and 13, which must work synchronously, each have a clock divider (not illustrated) for producing a divided clock signal whose rate is reduced to a half of the clock rate of a received clock signal. Preferably, S/P converters 12 and 13 each have an "internal" clock divider which is on the same chip as the converter. However, it may be possible to provide an "external" clock divider which is not on the same chip as the converter.

The divided clock signal from S/P converter 13 is supplied to the data-input (D-input) of a D-type flip-flop 15 after passing through a delay circuit 14 for delaying the signal by a predetermined delay time D1. On the other hand, the divided clock signal from S/P converter 12 is provided to the clock input (C-input) of D-type flip-flop 15. D-type flip-flop 15 latches the D-input signal at each active edge of the divided clock signal produced by S/P converter 12, and supplies its Q-output signal to a delay circuit 16. Delay circuit 16 delays the Q-output signal by a time delay D2. The delayed signal is then fed from delay circuit 16 back to S/P converter 13 to reset the internal clock divider of S/P converter 13. Therefore, delay circuit 14, D-type flip-flop 15 and delay circuit 16 together form a synchronization control unit 200 to maintain synchronization between S/P converters 12 and 13.

Therefore, the elements illustrated in FIG. 2 correspond to the elements illustrated in FIG. 1. More specifically, S/P converters 12 and 13 in FIG. 2 correspond to S/P converters 1 and 2 in FIG. 1. Delay circuit 14 and D-type flip-flop 15 in FIG. 2 correspond to synchronization failure detection unit 3 in FIG. 1. Delay circuit 16 in FIG. 2 corresponds to synchronization restoration unit 4 in FIG. 1.

FIG. 2 includes symbols (a), (b), (c), (d), (e), (f) and (g), indicating signal waveforms at various points. Moreover, FIG. 3 is a timing diagram illustrating the signal waveforms (a), (b), (c), (d), (e) , (f) and (g).

Figure 3:
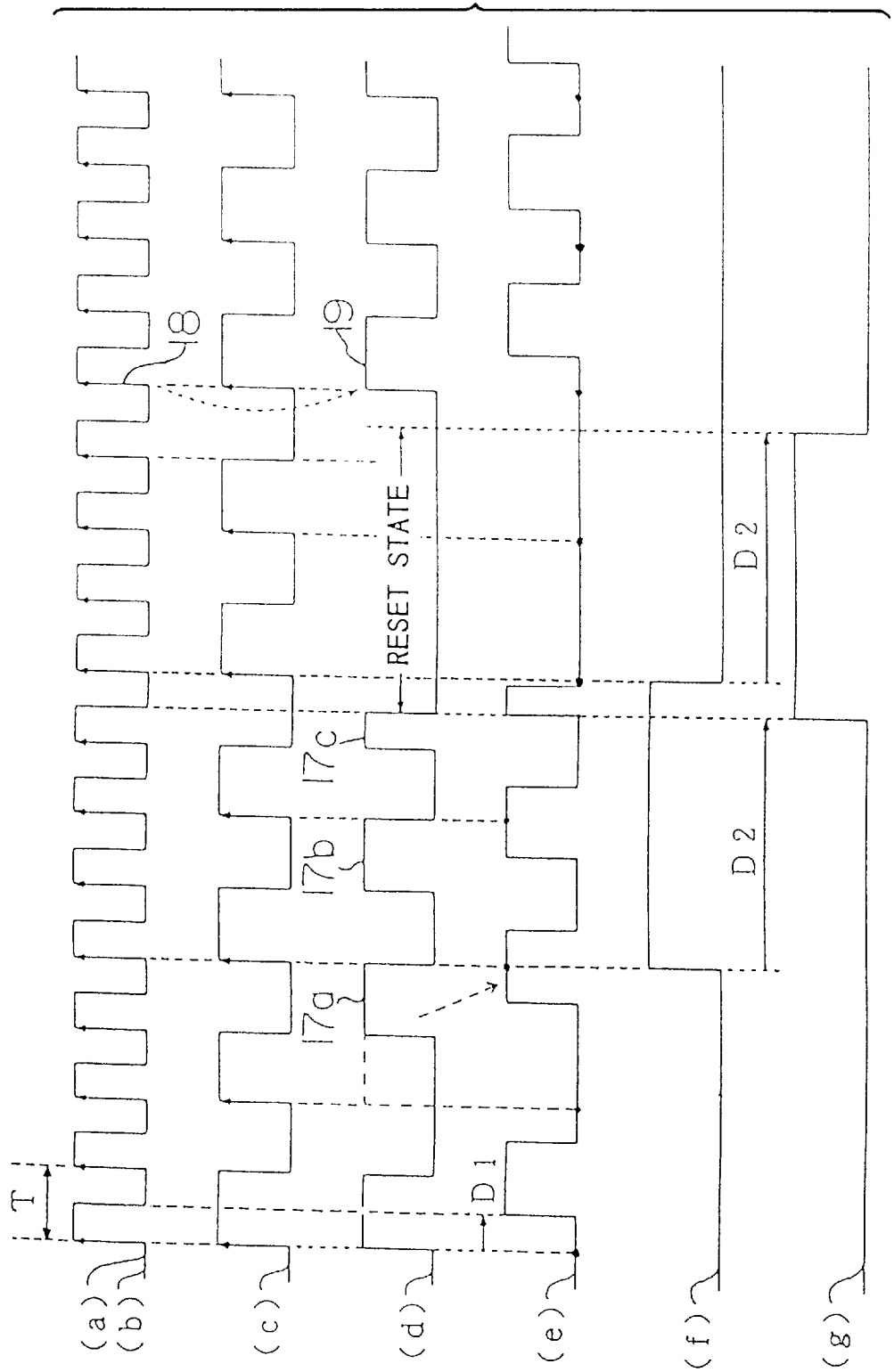
FIG. 3 is a timing diagram illustrating signal waveforms of the apparatus illustrated in FIG. 2, according to an embodiment of the present invention.

Referring now to FIG. 3, S/P converters 12 and 13 receive clock signals (a) and (b), respectively, from S/P converter 11. Clock signals (a) and (b) have a cycle time T. Since clock dividers integrated in S/P converters 11 and 12 divide the clock frequency by two, their respective outputs (c) and (d) will have a doubled cycle time, 2T. Delay circuit 14 applies the delay time D1 to the signal (d), and outputs a delayed signal as signal (e). Preferably, the delay time D1 is in the range of 0<D1<T. In this example, the delay D1 is set to T/2.

As long as the signals (c) and (d) are kept synchronous, D-type flip-flop 15 always latches, or samples, low levels of the signal (e) and thus the Q-output of D-type flip-flop 15, or the signal (f), will stay in a low level. However, when the clock divider in S/P converter 13 malfunctions, for example, due to noise or other causes, S/P converters 12 and 13 will not be in synchronization and irregular pulses 17a–17c (see FIG. 3) with a shifted phase will appear in the divided clock signal produced by S/P converter 13. As a result, the signal (e) at the D-input of D-type flip-flop 15 will also be shifted, as shown in FIG. 3, and it is sampled at the rising edge of signal (c). In FIG. 3, small dots on the signal waveform (e) signify such sampling points. Thus, a high level signal will appear at the Q-output of D-type flip-flop 15, as shown in FIG. 3 for the signal (f), indicating that S/P converters 12 and 13 have lost their synchronization.

Delay circuit 16 delays the high-level signal (f) by a delay time D2 that is preferably within the range indicated by the following Equation (1).
Equation (1):

$$(2n-1)T < D2 < 2nT (n=1, 2, 3, \ldots)$$

In the present example, the delay time D2 is set to, for example, (3+1/2)T.

Delay circuit 16 outputs the signal (g), which lags by D2 behind the signal (f), to the clock divider in S/P converter 13. The clock divider is reset by a reset operation while the signal (g) is high. The reset operation forces the divided clock signal output (d) of S/P converter 13 to become low. It is not until a rising edge 18 of the clock signal (b) that a divided clock pulse 19 is generated as the first pulse after recovery.

Since the delay time D2 is carefully selected according to the above Equation (1), the first clock edge 18 occurring after the reset signal is removed (that is, after the signal (g) becomes low) will be always synchronized with the rising edge of the divided clock signal (c). Conversely, the first clock edge 18 never meets with the falling edge of the signal (c). The divided clock signal 19 from S/P converter 13 and the divided clock signal (c) from S/P converter 12 are now in phase with each other, and thus S/P converters 12 and 13 have successfully regained synchronization.

Therefore, according to the above embodiments of the present invention, first and second serial-to-parallel (S/P) converters (such as S/P converters 12 and 13) produce respectively corresponding first and second divided clock signals of, and in synchronization with, a main clock signal (for example, see clock signals (a) and (b) in FIG. 3) . The main clock signal is formed of a plurality of pulses. Therefore, the first and second divided clock signals are in synchronization with each other. A synchronization failure occurs when the first and second divided clock signals fall out of synchronization due to an error in the second S/P converter. When a synchronization failure occurs, a synchronization control unit causes the second divided clock signal to be maintained at a constant level for a fixed period of time and, after the fixed period of time, to be synchronized with the main clock signal beginning with an edge of a first pulse of the main clock signal occurring after the fixed period of time. See, for example, the waveforms illustrated in FIG. 3.

Figure 4:
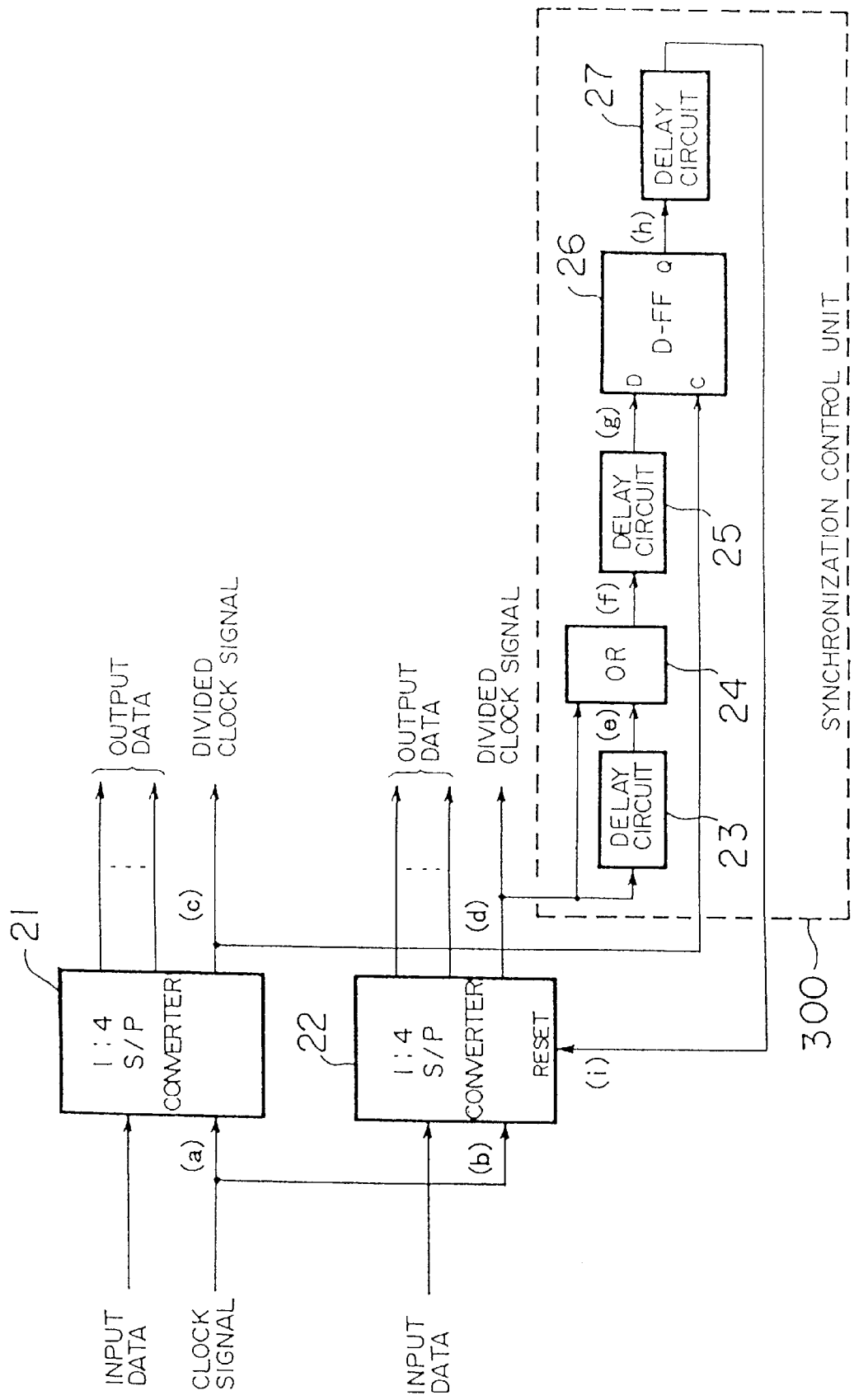
FIG. 4 is a diagram of an apparatus for maintaining synchronization between serial-to-parallel converters operating in parallel, according to an additional embodiment of the present invention.

FIG. 4 is a diagram of an apparatus for maintaining synchronization between serial-to-parallel converters operating in parallel, according to an additional embodiment of the present invention. While FIG. 2 illustrates S/P converters 12 and 13 which perform 1:2 serial-to-parallel conversion, FIG. 4 illustrates S/P converters which perform 1:4 serial-to-parallel conversion.

Referring now to FIG. 4, two S/P converters 21 and 22 are implemented in separate chips and perform 1:4 serial-to-parallel conversion, where a serial input data stream is reformed into a quadruple-wide parallel data sequence at a quarter rate. Although not illustrated in FIG. 4, an S/P converter (such as S/P converter 11 illustrated in FIG. 2) is placed at an earlier stage of S/P converters 21 and 22 to provide data and a clock signal.

For proper system operation, S/P converters 21 and 22 should be synchronized. S/P converters 21 and 22 each have a clock divider (not illustrated) for producing a divided clock signal whose rate is reduced to a quarter of an input clock rate. Preferably, the clock dividers are "internal" clock dividers. That is, S/P converter 21 has a clock divider on the same chip as its converting circuitry. Similarly, S/P converter 22 has a clock divider on the same chip as its converter circuitry.

The divided clock signal output from S/P converter 22 reaches the inputs of a logical OR gate 24 via two paths. One path is a direct connection path and the other is via a delay circuit 23. Delay circuit 23 delays the divided clock signal output from S/P converter 22 by a delay time D4. The output of logical OR gate 24 is then delayed by a delay circuit 25 with a delay time D5. The output of delay circuit 25 is provided to the D-input of a D-type flip-flop 26. On the other hand, the divided clock signal from S/P converter 21 is provided to the clock input (C-input) of D-type flip-flop 26. D-type flip-flop 26 latches the D-input signal at each clock edge of the divided clock signal from S/P converter 21 and supplies its Q-output signal to a delay circuit 27. Delay circuit 27 delays the Q-output signal by a delay time D6. This delayed signal is then fed back to S/P converter 22 to reset the clock divider of S/P converter 22. Therefore, delay circuit 23, logical OR gate 24, delay circuit 25, D-type flip-flop 26 and delay circuit 27 together form a synchronization control unit 300 which maintains synchronization between S/P converters 21 and 22.

Figure 6:
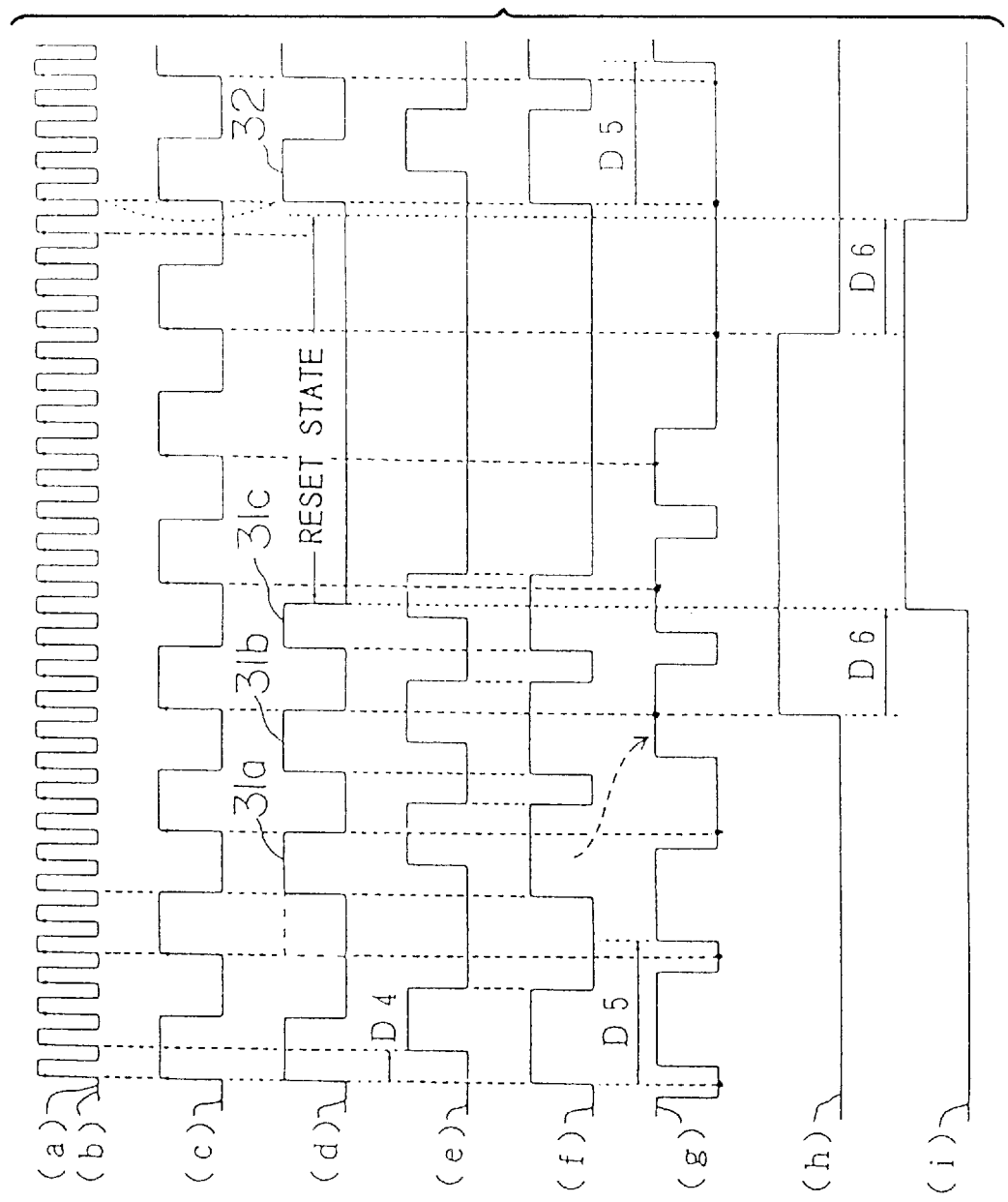
FIG. 6 is a timing diagram illustrating signal waveforms of the apparatus illustrated in FIG. 4, for a second type of synchronization failure, according to an embodiment of the present invention.
Figure 7:
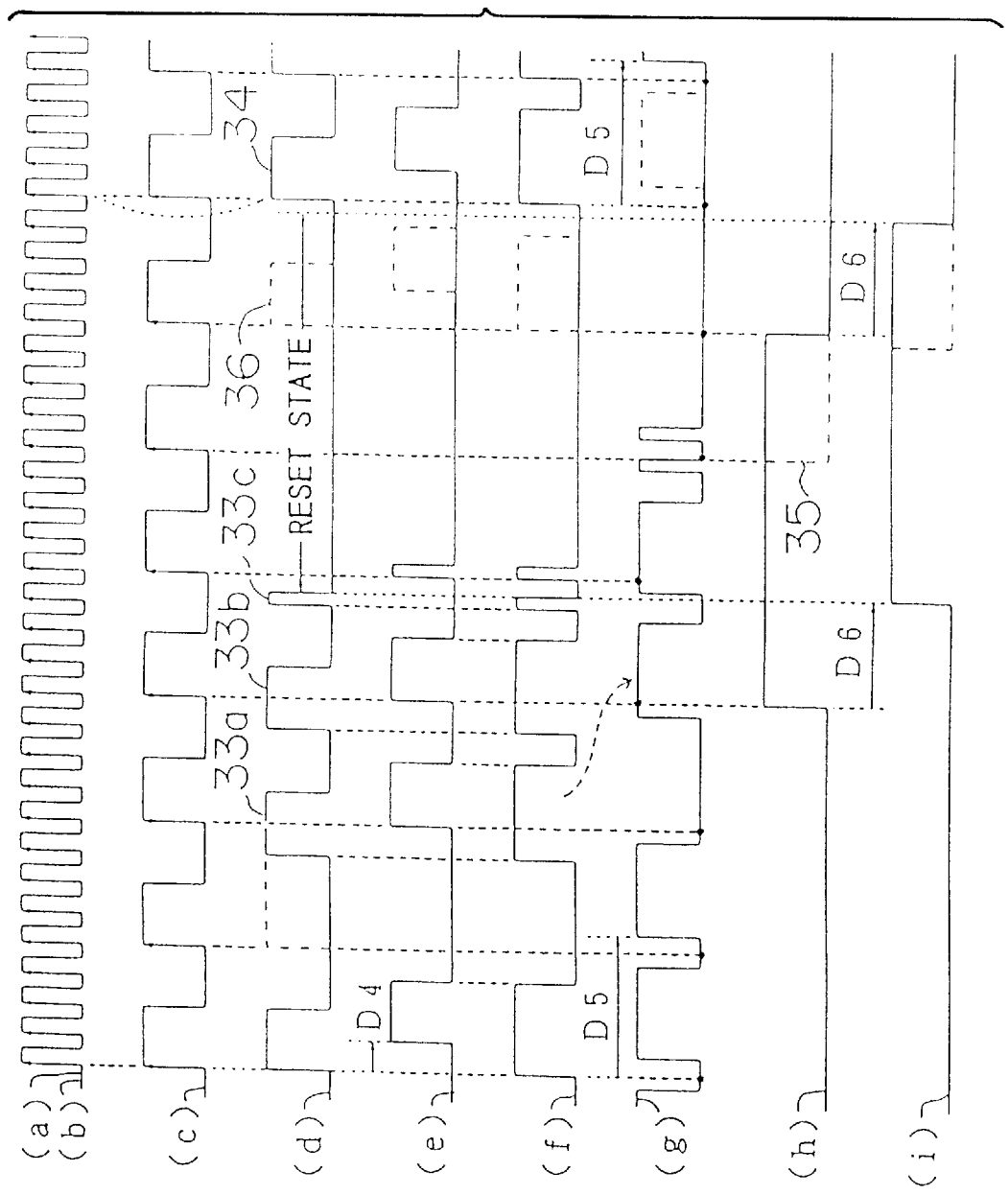
FIG. 7 is a timing diagram illustrating signal waveforms of the apparatus illustrated in FIG. 4, for a third type of synchronization failure, according to an embodiment of the present invention.

FIG. 4 includes symbols (a), (b), (c), (d), (e), (f), (g), (h) and (i) indicating signal waveforms at various points. Moreover, FIGS. 5–7 are timing diagrams illustrating the signal waveforms (a), (b), (c), (d), (e), (f), (g), (h) and (i) for different types of synchronization failures.

Figure 5:
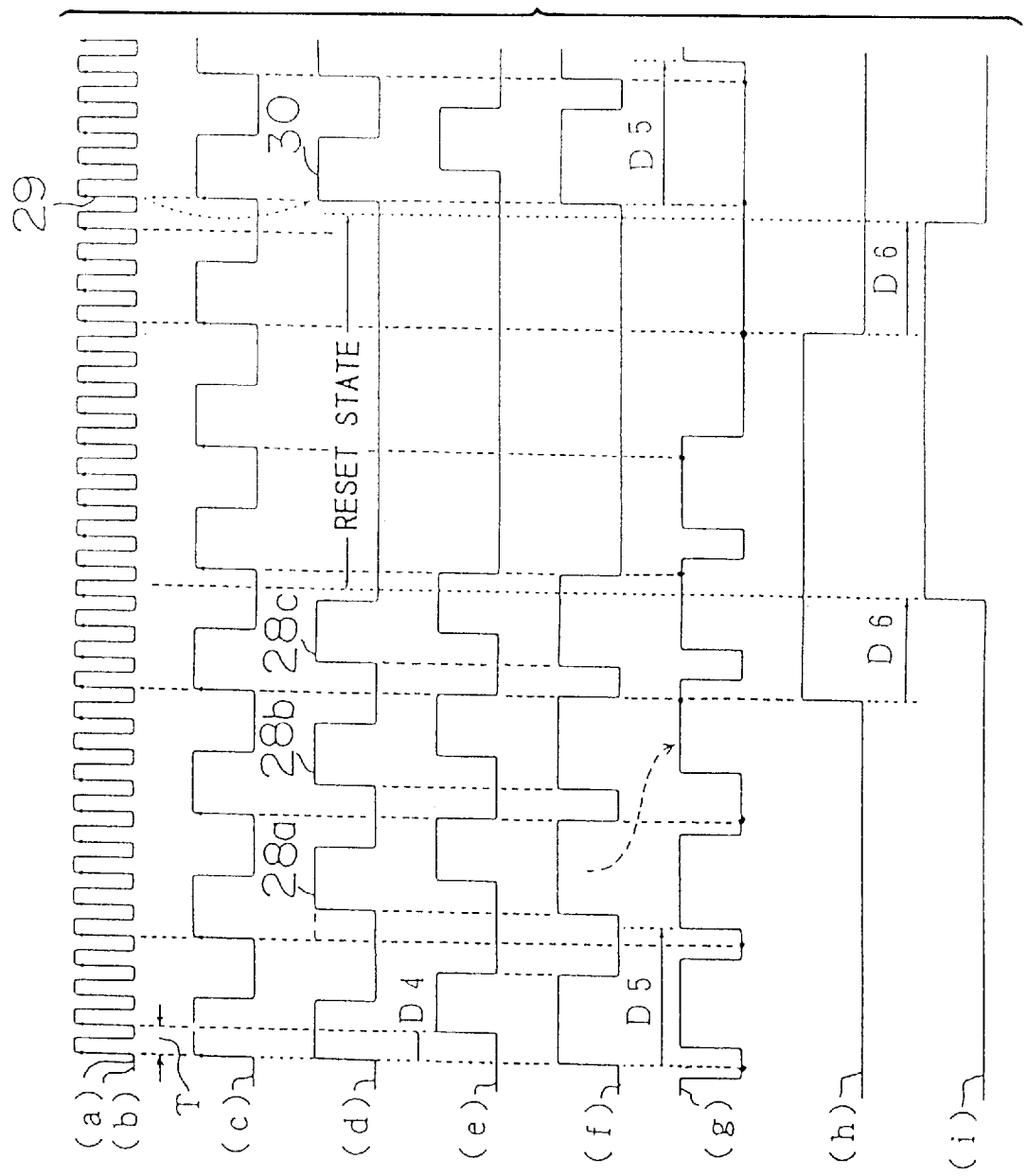
FIG. 5 is a timing diagram illustrating signal waveforms of the apparatus illustrated in FIG. 4, for a first type of synchronization failure, according to an embodiment of the present invention.

More specifically, FIG. 5 is a timing diagram illustrating signal waveforms of the apparatus illustrated in FIG. 4, for a first type of synchronization failure, according to an embodiment of the present invention. Referring now to FIG. 5, S/P converters 21 and 22 receive clock signals (a) and (b) with the cycle time T from the previous stage. Since clock dividers integrated in S/P converters 21 and 22 divide the clock frequency by four, the divided clock signals (c) and (d) of S/P converters 21 and 22 will have a cycle time 4T. Delay circuit 23 applies the time delay D4 to the signal (d), to produce the signals (e). Delay D4 is set, for example, to be substantially equal to T. Logical OR gate 24 outputs the result of a logical OR operation for the signals (d) and (e), to produce the signal (f). The signal (f) is provided to delay circuit 25. In other embodiments of the present invention discussed in more detail further below, delay circuit 23 and logical OR gate 24 enable D-type flip-flop 26 in a later stage to detect various types of synchronization failure.

Delay circuit 25 delays the signal (f) by the delay time D5, to produce the signal (g). For example, the delay time D5 is set to (4+1/2)T. The signal (g) is then provided to the D-input of D-type flip-flop 26. As long as the signals (c) and (d) are well synchronized, D-type flip-flop 26 always samples low levels of the signal (g). Therefore, the Q-output of D-type flip-flop 26, or the signal (h), will stay at a low level. However, for example, when the clock divider in S/P converter 22 malfunctions due to noise or other causes, the synchronization will fail and the signal (d) will exhibit irregular pulses 28a–28c (see FIG. 5) with a time delay of, for example, T. As a result, as shown in FIG. 5, the signal (g) at the D-input of D-type flip-flop 26 will also be shifted. By sampling such a signal (g) at the rising edge of the signal (c), as indicated by small dots in FIG. 5, D-type flip-flop 26 outputs a high level signal at the Q-output. That is, the signal (h) indicates that S/P converters 21 and 22 have lost their synchronization.

Delay circuit 27 delays the high-level signal (h) with the delay time D6, to produce the signal (i). The delay time D6 is preferably defined within the range indicated by the following Equation (2).

Equation (2):

$(4n-1)T < D6 < 4nT \ (n=1, 2, 3, \ldots)$

For example, in the present example, the delay time D6 is set to (3+1/2)T, as shown in FIG. 5.

The signal (i) is provided to the clock divider in S/P converter 22. The clock divider is reset by a reset operation while the signal (i) is at a high level. More specifically, the reset operation drives the divided clock signal (d) of S/P converter 22 to a low level. It is not until a rising edge 29 of the clock signal (b) that a divided clock pulse 30 is generated as the first pulse after recovery.

Since the delay time D6 is carefully selected to satisfy Equation (2), above, the first clock edge 29 generated after the reset signal is removed will always be synchronized with the rising edge of the divided clock signal (c). Therefore, the divided clock signal 30 from S/P converter 22 and the divided clock signal (c) from S/P converter 21 are now in phase with each other, and the synchronization between S/P converters 21 and 22 is successfully restored.

FIG. 6 is a timing diagram illustrating signal waveforms of the apparatus illustrated in FIG. 4, for a second type of synchronization failure, according to an embodiment of the present invention. More specifically, FIG. 6 shows signal waveforms in the case of a second type of synchronization failure, where the clock divider in S/P converter 22 malfunctions due to noise or other causes, and the signal (d) exhibited irregular pulses 31a–31c with a time delay of 2T.

In a similar manner to that shown in FIG. 5, the divided clock signal 32 from S/P converter 22 and the divided clock signal (c) from S/P converter 21 become in phase with each other. Therefore, the synchronization between S/P converters 21 and 22 is successfully restored.

FIG. 7 is a timing diagram illustrating signal waveforms of the apparatus illustrated in FIG. 4, for a third type of synchronization failure, according to an embodiment of the present invention. More specifically, FIG. 7 shows signal waveforms in the case of a third type of synchronization failure, where the clock divider in S/P converter 22 malfunctions due to noise or other causes and the signal (d) exhibits irregular pulses 33a–33c with a time delay of 3T. In a similar manner to that shown in FIGS. 5 and 6, the divided clock signal 34 from S/P converter 22 and the divided clock signal (c) from S/P converter 21 become in phase with each other. Therefore, the synchronization between S/P converters 21 and 22 is successfully restored.

The signal (h) may return to a low level, as indicated by the broken line 35 (see FIG. 7), depending on the timing condition of the signal (g). Even in such a case, recovery of the divided clock signal (d) will be synchronized with the divided clock signal (c), as indicated by the broken line 36 (see FIG. 7).

According to the above embodiments of the present invention, S/P converters 12 and 13 (see FIG. 2) and S/P converters 21 and 22 (see FIG. 4) provide serial-to-parallel conversion with ratios 1:2 and 1:4, respectively. The present invention, however, is not restricted to those ratios, and can be applicable to other converter circuits having arbitrary conversion ratios.

Figure 8:
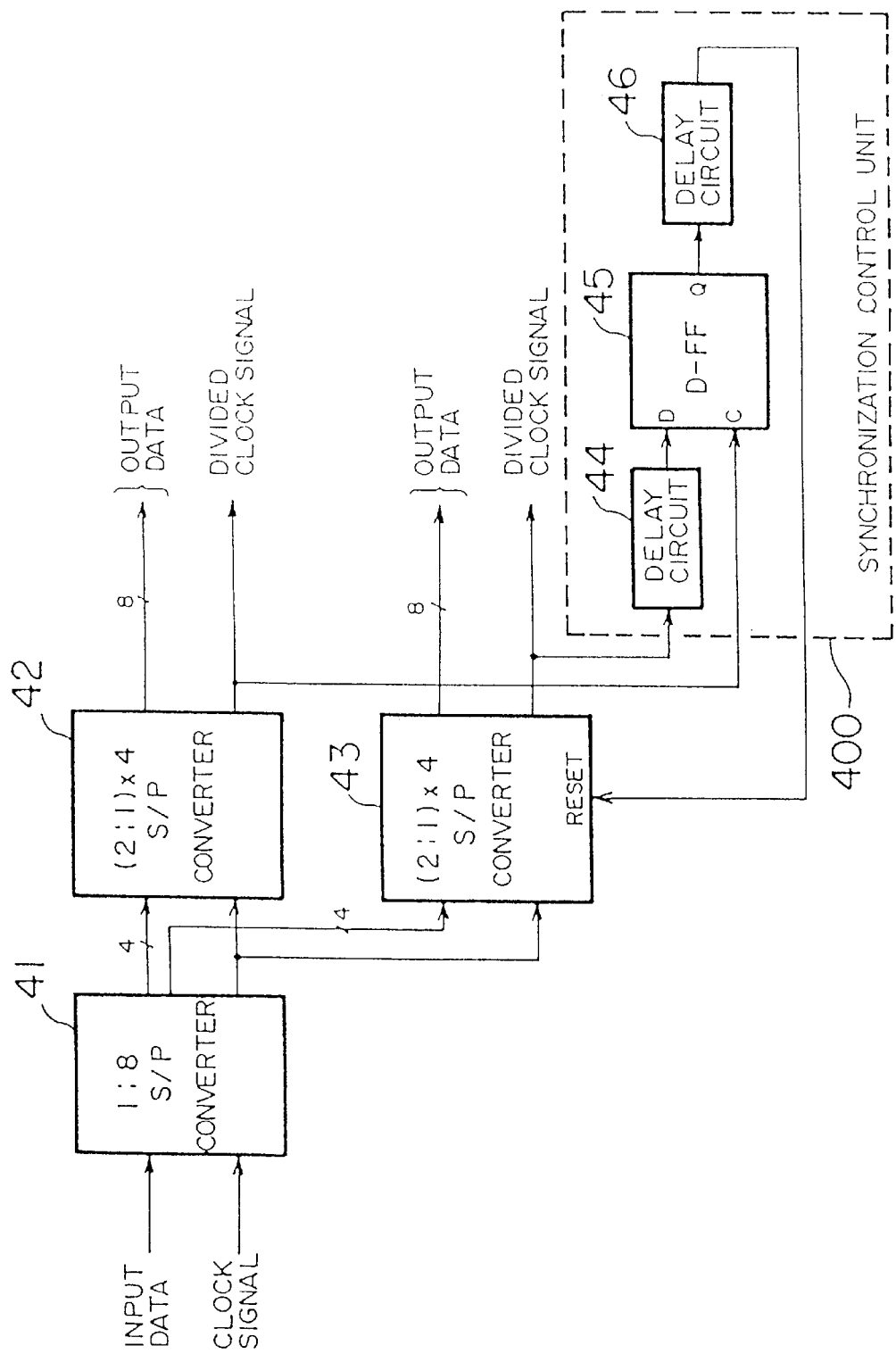
FIG. 8 is a diagram of an apparatus for maintaining synchronization between serial-to-parallel converters operating in parallel, according to an additional embodiment of the present invention.

For example, FIG. 8 is a diagram of an apparatus for maintaining synchronization between serial-to-parallel converters operating in parallel, according to an additional embodiment of the present invention. The embodiment of the present invention illustrated in FIG. 8 is basically the same as the embodiment of the present invention illustrated in FIGS. 2–3 except for the conversion ratios of the S/P converters are different.

More specifically, referring now to FIG. 8, an S/P converter 41 performs 1:8 serial-to-parallel conversion, and the parallel output is divided into halves, or 4:4. One half is supplied to an S/P converter 42, and one half is supplied to an S/P converter 43. S/P converters 42 and 43 each include four serial-to-parallel conversion circuits with the conversion ratio of 1:2, thus doubling the data width from four to eight. S/P converters 42 and 43 each incorporate a clock divider for producing a divided clock signal having a rate reduced to a half of its input clock rate. Although the four internal 1:2 S/P converters can operate synchronously by using the divided clock signal as a common timebase, the separate S/P converters 42 and 43 generally require another mechanism to maintain phase synchronization between themselves. Therefore, a synchronization mechanism is provided by delay circuit 44, D-type flip-flop 45 and delay circuit 46.

More specifically, delay circuit 44 and D-type flip-flop 45 in FIG. 8 correspond to synchronization failure detection unit 3 illustrated in FIG. 1. Delay circuit 46 in FIG. 8 corresponds to synchronization restoration unit 4 in FIG. 1. Moreover, delay circuit 44, D-type flip-flop 45 and delay circuit 46 in FIG. 8 operate in a similar manner as delay circuit 14, D-type flip-flop 15, and delay circuit 16 in FIG. 2. Therefore, delay circuit 44, D-type flip-flop 45 and delay circuit 46 together form a synchronization control unit 400 which maintains synchronization between S/P converters 42 and 43.

Figure 9:
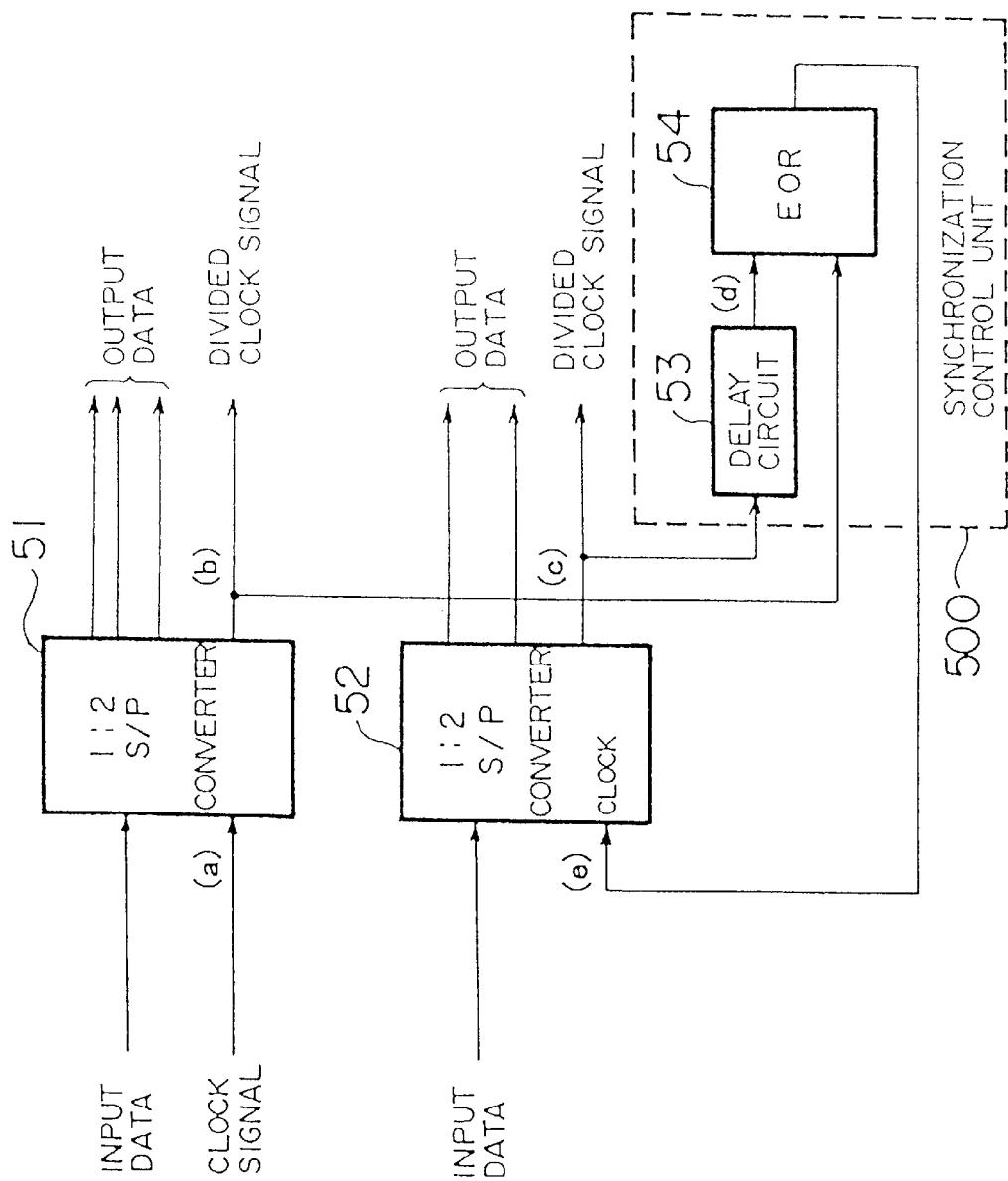
FIG. 9 is a diagram of an apparatus for maintaining synchronization between serial-to-parallel converters operating in parallel, according to a further embodiment of the present invention.

FIG. 9 is a diagram of an apparatus for maintaining synchronization between serial-to-parallel converters operating in parallel, according to a further embodiment of the present invention. Referring now to FIG. 9, two S/P converters 51 and 52, implemented in separate chips, carry out 1:2 serial-to-parallel conversion where a serial input data stream is reformed into a double-wide parallel data sequence at a quarter rate. Although not illustrated in FIG. 9, an S/P converter (such as S/P converter 11 illustrated in FIG. 2) is placed at an earlier stage of S/P converters 51 and 52 to provide data and a clock signal.

For proper system operation, conversion timings in S/P converters 51 and 52 should be maintained in phase. Therefore, each S/P converters 51 and 52 has an internal clock divider (not illustrated) for producing a divided clock signal having a rate which is reduced to a half of the input clock rate. As illustrated in FIG. 9, a clock signal from a previous stage is supplied to S/P converter 51, but not to S/P converter 52.

The divided clock signal from S/P converter 52 is provided to a delay circuit 53 which delays the divided clock signal by a delay time D8. The delayed divided clock signal is then fed from delay circuit 53 to one input of an exclusive OR gate 54. By contrast, the divided clock signal from S/P converter 51 is connected to the other input of exclusive OR gate 54, without being delayed. Exclusive OR gate 54 performs an exclusive-OR logical operation for both inputs and provides the resulting signal to S/P converter 52 as a clock input. The internal clock divider of S/P converter 52 divides this clock input into a half rate. Therefore, in FIG. 9, delay circuit 53 and exclusive OR gate 54 together form a synchronization control unit 500 which maintains synchronization between S/P converters 51 and 52.

Figure 10:
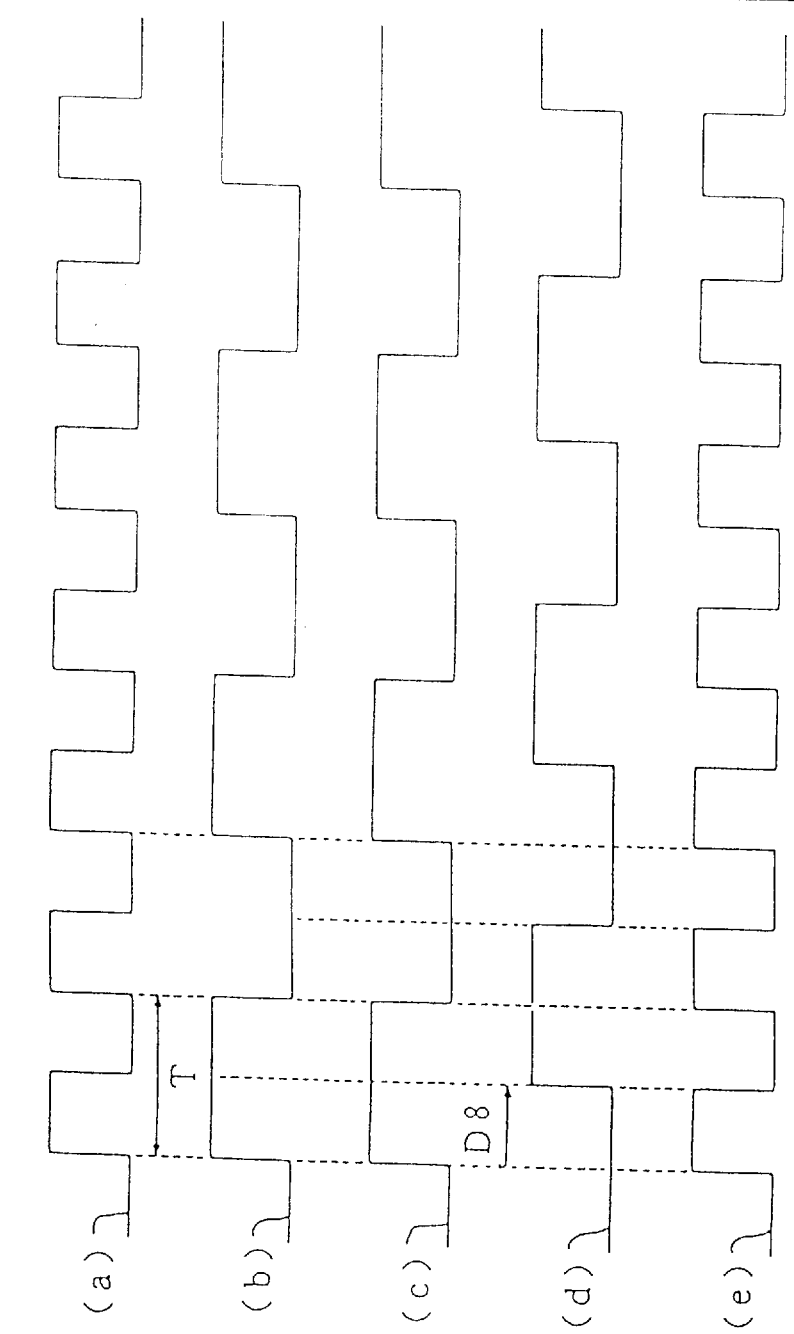
FIG. 10 is a timing diagram illustrating signal waveforms of the apparatus illustrated in FIG. 9, when divided clock signals are synchronized, according to an embodiment of the present invention.
Figure 11:
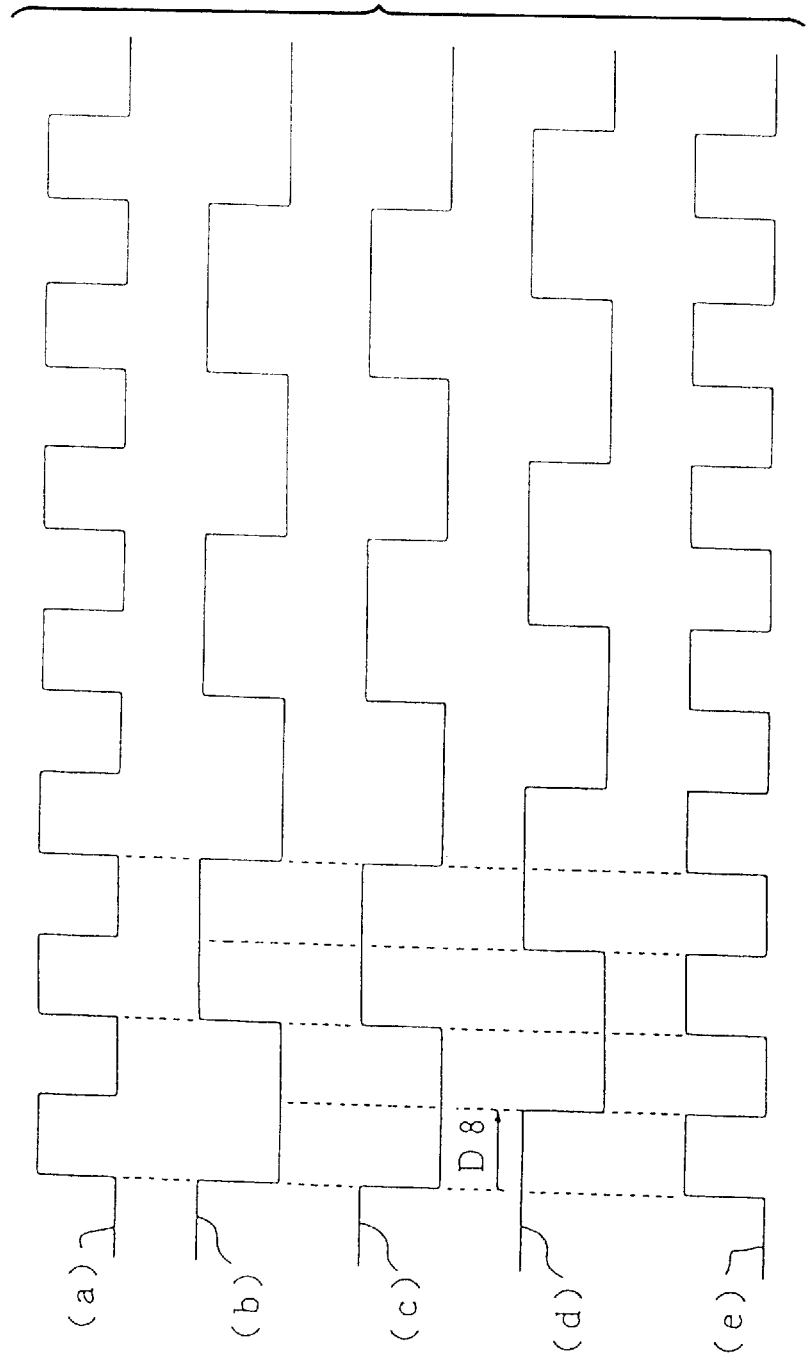
FIG. 11 is a timing diagram illustrating signal waveforms of the apparatus illustrated in FIG. 9, when divided clock signals are synchronized, according to an embodiment of the present invention.
Figure 12:
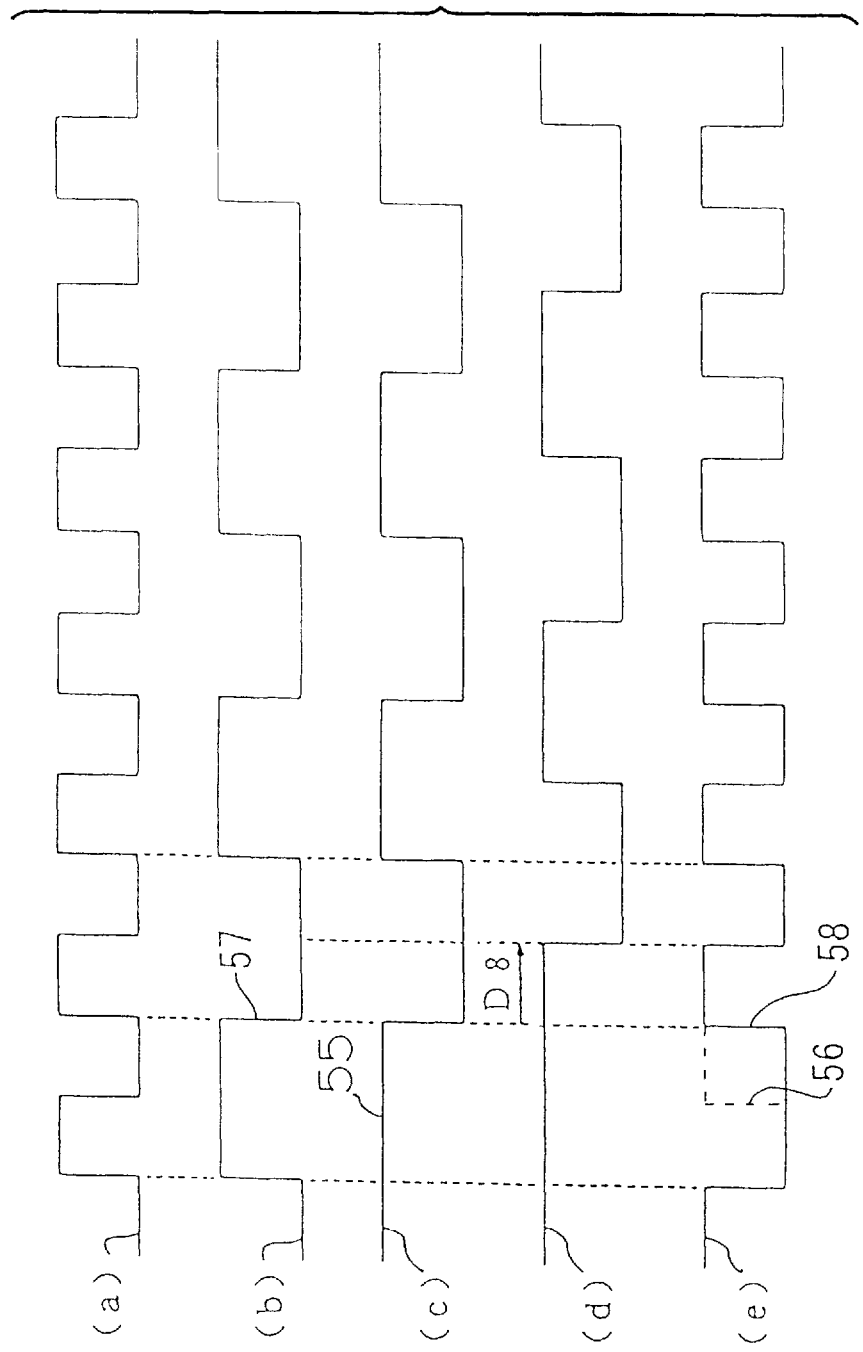
FIG. 12 is a timing diagram illustrating signal waveforms of the apparatus illustrated in FIG. 9, for a first type of synchronization failure, according to an embodiment of the present invention.
Figure 13:
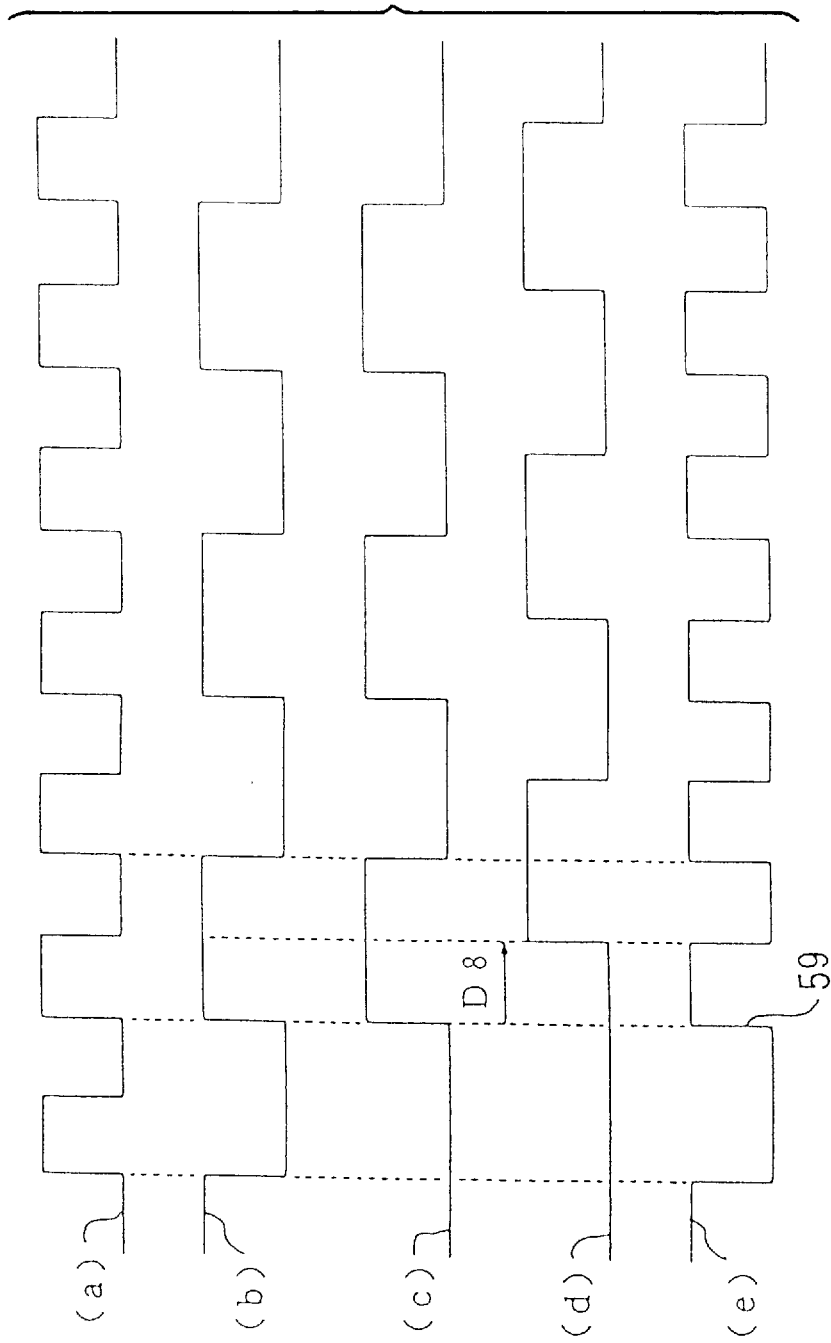
FIG. 13 is a timing diagram illustrating signal waveforms of the apparatus illustrated in FIG. 9, for a second type of synchronization failure, according to an embodiment of the present invention.

FIG. 9 includes symbols (a), (b), (c), (d) and (e), indicating signal waveforms at various points. Moreover, FIGS. 10–13 are timing diagrams illustrating the signal waveforms (a), (b), (c), (d) and (e) in specific situations. More specifically, FIGS. 10 and 11 show normal operations. FIG. 12 illustrates the signal waveforms for a first type of synchronization failure. FIG. 13 illustrates the signal waveforms for a second type of synchronization failure.

Referring now to FIG. 10, the divided clock signals (b) and (c) output from S/P converters 51 and 52, respectively, are synchronized. FIG. 10 specifically shows a case that the initial state of both divided clock signals is a low level. S/P converter 51 receives a clock signal (a) with the cycle time T from the previous stage. Since the clock divider integrated in S/P converter 51 divides the clock frequency by two, its divided clock signal (b) will have a cycle time 2T. As long as S/P converters 51 and 52 are synchronous, the divided clock signal (c) from S/P converter 52 is generated as in FIG. 10. Since delay circuit 53 delays the signal (c) by a delay time D8, the exclusive OR gate 54 outputs a continuous pulse train (e) having a waveform identical to that of the clock signal (a).

FIG. 11 shows a case where the divided clock signals (b) and (c) output from S/P converters 51 and 52, respectively, are synchronized. However, in contrast to FIG. 10, FIG. 11 shows a case that the initial state of both divided clock signals is a high level.

In contrast to FIGS. 10 and 11, FIGS. 12 and 13 illustrate how the apparatus will behave when the divided clock signals (b) and (c) are not synchronized. More specifically, FIG. 12 shows the case where the initial state of the divided clock signal (b) is a low level, but that of the other divided clock signal (c) is a high level. Referring now to FIG. 12, S/P converter 51 receives a clock signal (a) with the cycle time T from the previous stage, thus generating the divided clock signal (b). S/P converter 52 generates the divided clock signal (c) starting with a high level 55. Delay circuit 53 delays the signal (c) by the delay time D8, and thus exclusive OR gate 54 outputs the resultant signal (e). Since the initial levels of the divided clock signals (b) and (c) are different from each other, any transition, such as one indicated by a broken line 56 in FIG. 12, will not happen to the signal (e) during the first clock cycle. The signal (e) rises at the falling edge 57 of the divided clock signal (b), and this first rising edge 58 triggers a high-to-low transition of the divided clock signal (c). As a result, the divided clock signals (b) and (c) go to a low level simultaneously and, thereafter, will operate in the same way as illustrated in FIG. 10. Therefore, S/P converters 51 and 52 will successfully be synchronized.

FIG. 13 shows a specific case of synchronization failure, where, in contrast to FIG. 12, the initial state of the divided clock signal (b) is a high level while the initial state of the divided clock signal (c) is a low level. Similar to the case of FIG. 12, the divided clock signal (c) adjusts its own phase to the divided clock signal (b) at a rising edge 59, and S/P converters 51 and 52 will successfully be synchronized.

Figure 14:
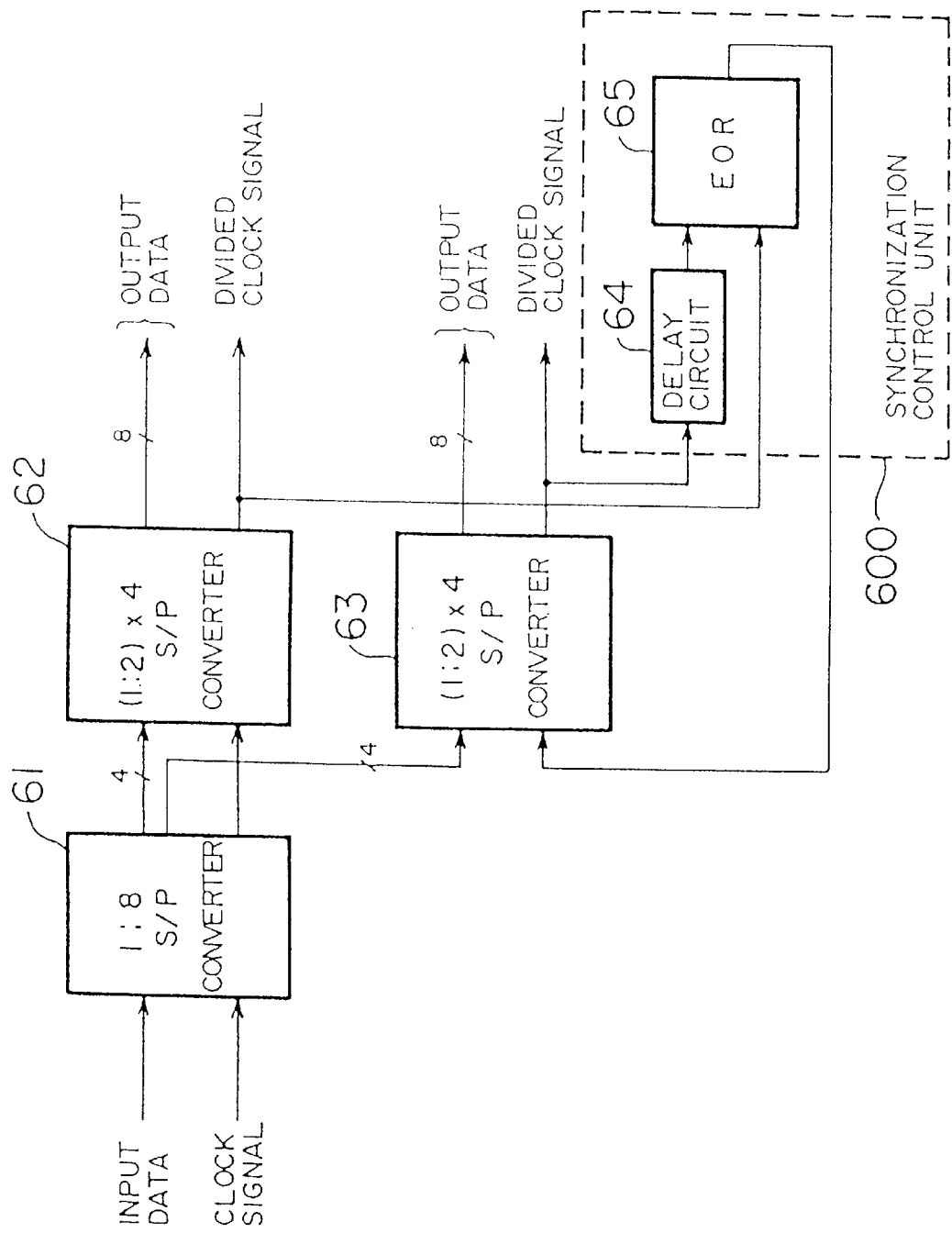
FIG. 14 is a diagram of an apparatus for maintaining synchronization between serial-to-parallel converters operating in parallel, according to an embodiment of the present invention.

FIG. 14 is a diagram of an apparatus for maintaining synchronization between serial-to-parallel converters operating in parallel, according to an additional embodiment of the present invention. The embodiment of the present invention illustrated in FIG. 14 is basically the same as the embodiment of the present invention illustrated in FIG. 9, except for the difference in data conversion schemes.

More specifically, in FIG. 14, an S/P converter 61 performs 1:8 serial-to-parallel conversion, and the resultant parallel output is divided into 4:4 for further conversion in S/P converters 62 and 63. Therefore, S/P converters 62 and 63 each include four conversion circuits (not illustrated). Each of the conversion circuits performs 1:2 serial-to-parallel conversion. As a result, four signal inputs to S/P converter 62 are demultiplexed into eight signals. Similarly, four signal inputs to S/P converter 63 are demultiplexed into eight signals.

S/P converters 62 and 63 each has an internal clock divider (not illustrated) for producing a divided clock signal whose rate is reduced to a half of the input clock rate. The four S/P conversion circuits integrated in each S/P converter 62 and 63 can operate synchronously by using this divided clock signal as a common timebase. However, the separate S/P converters 62 and 63 generally require another synchronism mechanism to keep in phase with each other.

Such a synchronization mechanism is formed by a delay circuit 64 and an exclusive OR gate 65, as illustrated in FIG. 14. Moreover, delay circuit 64 and exclusive OR gate 65 illustrated in FIG. 14 are exactly the same as delay circuit 53 and exclusive OR gate 54 illustrated in FIG. 9 and operate in the same manner. Therefore, delay circuit 64 and exclusive OR gate 65 together form an synchronization control unit 600 which maintains synchronization between S/P converters 62 and 63.

The above embodiments of the present invention are described as relating to serial-to-parallel converters. However, the above embodiments of the present invention are also applicable to parallel-to-serial converters.

Figure 15:
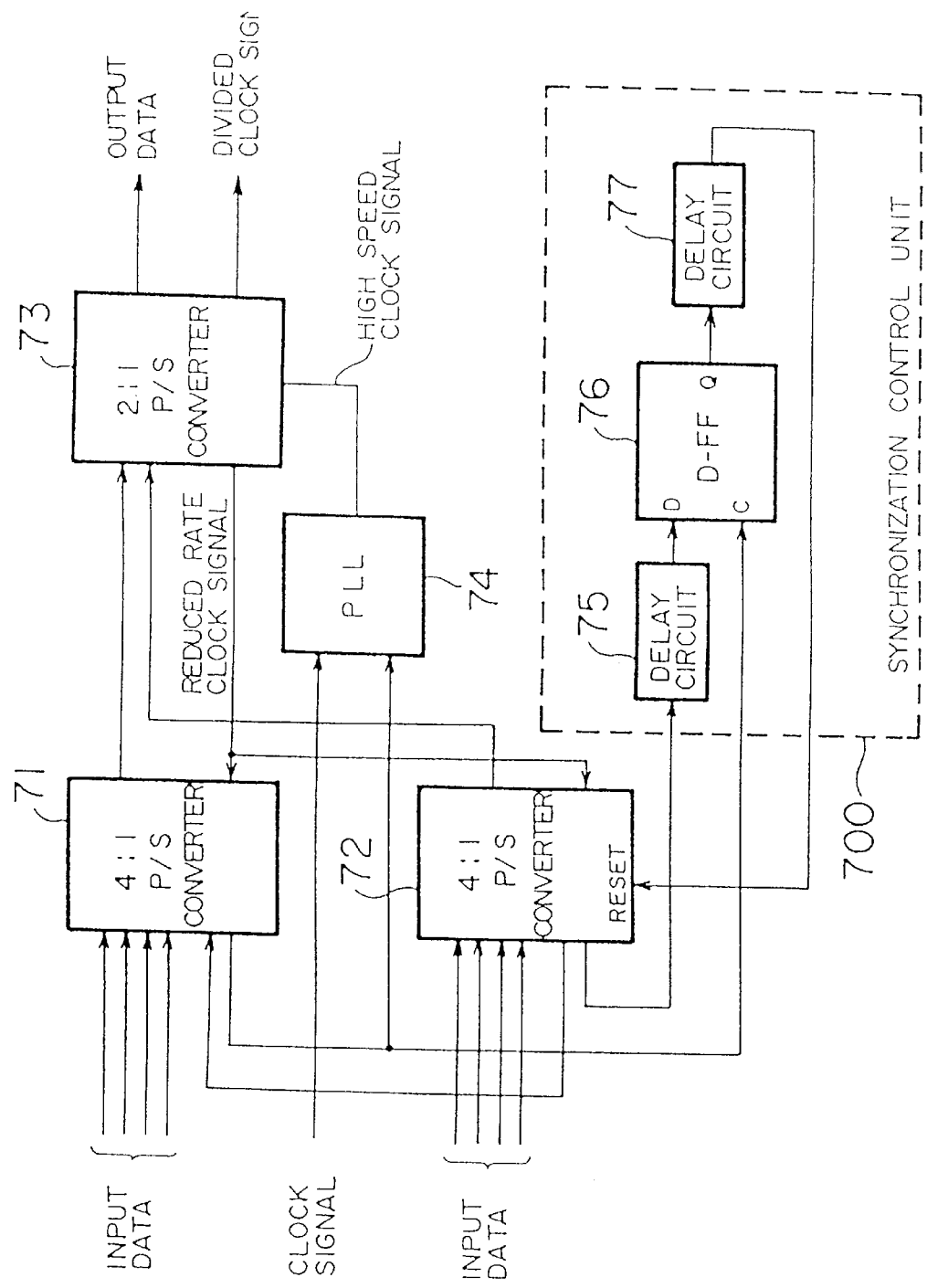
FIG. 15 is a diagram of an apparatus for maintaining synchronization between parallel-to-serial converters operating in parallel, according to an embodiment of the present invention.

For example, FIG. 15 is a diagram of an apparatus for maintaining synchronization between parallel-to-serial converters operating in parallel, according to an embodiment of the present invention. Referring now to FIG. 15, parallel-to-serial (P/S) converters 71 and 72 each performs 4:1 parallel-to-serial data conversion, where four parallel inputs are reformed into a serial data stream with a quadruple transfer rate. P/S converters 71 and 72 provide their respective serial data outputs to a 2:1 P/S converter 73. P/S converter 73 performs 2:1 parallel-to-serial data conversion, multiplexing the serial data streams into one serial data stream with a doubled transfer rate. P/S converters 71, 72 and 73 are preferably implemented as separate chips.

Since P/S converters 71 and 72 should run in parallel, they should be keep in phase. For this purpose, P/S converters 71 and 72 each includes a clock divider (not illustrated) for producing a divided clock signal whose rate is reduced to a quarter of the frequency of a high speed clock supplied by P/S converter 73 to the serial clock input of P/S converters 71 and 72. A phase locked loop (PLL) circuit 74 is coupled to P/S converters 71 and 72, and receives a clock signal (for example, at 600 MHz) from an external source. PLL circuit 74 also receives the divided clock signal (for example, at 600 MHz) from S/P converter 71. With reference to the phases of the clock signal from the external source and the divided clock signal from S/P converter 71, PLL circuit 74 generates a high-speed clock signal at, for example, 4.8 GHz for the clock divider in P/S converter 73. The clock divider in P/S converter 73 reduces the clock rate to, for example, 2.4 GHz for use in P/S converters 71 and 72.

The clock divider in P/S converter 72 provides a divided clock signal to a delay circuit 75. Delay circuit 75 delays the divided clock signal by a delay time D11. The delayed signal is then provided to the D-input of a D-type flip-flop 76. On the other hand, the divided clock signal from S/P converter 71 is sent to the clock input of D-type flip-flop 76. D-type flip-flop 76 latches the D-input signal at each active clock edge of the divided clock signal from S/P converter 71, and supplies a Q-output signal to a delay circuit 77. Delay circuit 77 delays the Q-output signal by a time delay D12. The delayed Q-output signal is then fed back to S/P converter 72 to reset the clock divider in S/P converter 72.

The embodiment of the present invention illustrated in FIG. 15 operates in the same, manner as the embodiment of the present invention illustrated in FIGS. 2–3. That is, when a synchronization failure is detected by delay circuit 75 and D-type flip-flop 76, a reset signal is generated to reset the clock divider in P/S converter 72. This reset signal is applied only to P/S converter 72 and does not affect the operation of P/S converters 71 and 73 or PLL circuit 74. Therefore, delay circuit 75, D-type flip-flop 76 and delay circuit 77 together form a synchronization control unit 700 which maintains synchronization between P/S converters 71 and 72.

Figure 16:
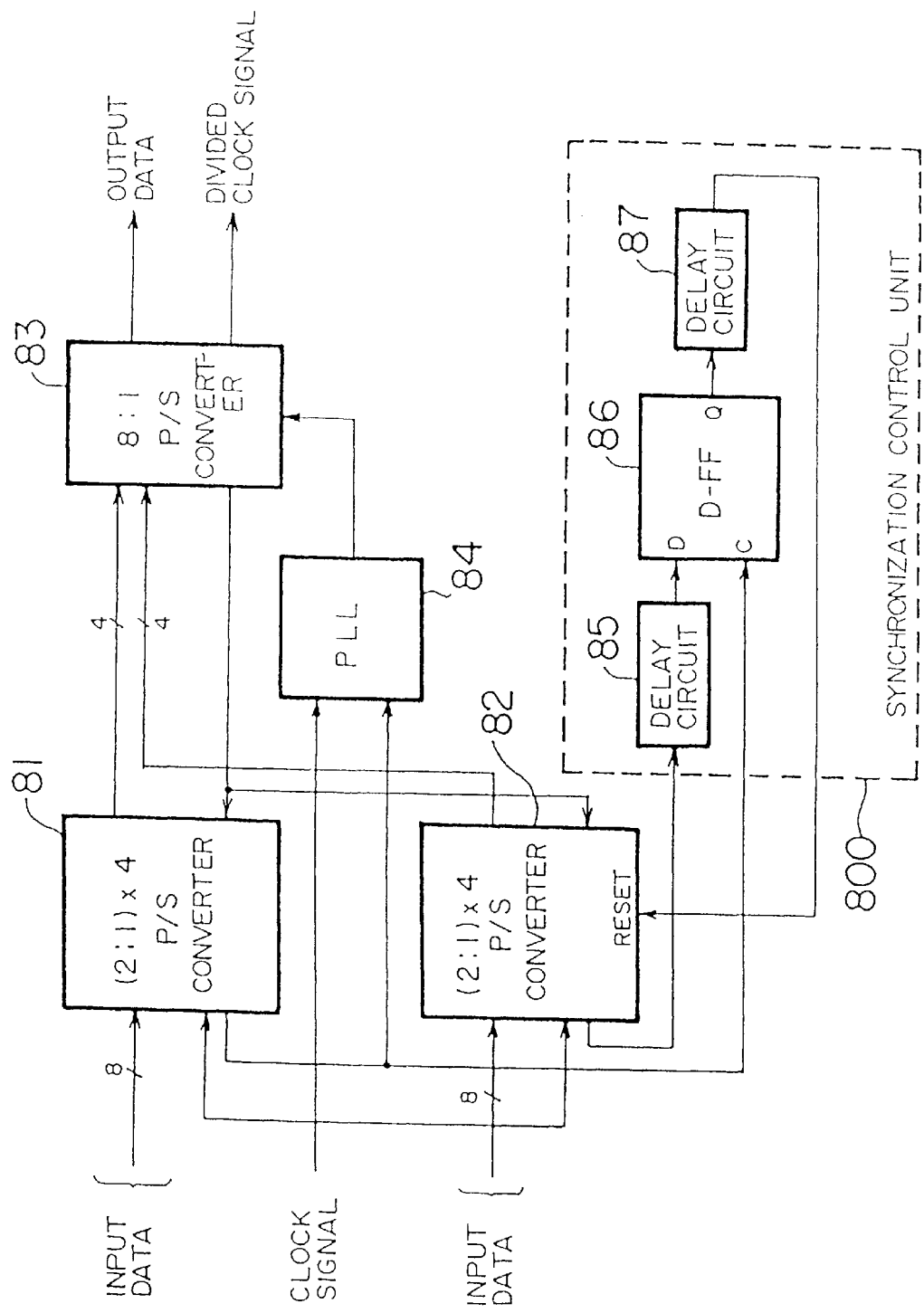
FIG. 16 is a diagram of an apparatus for maintaining synchronization between parallel-to-serial converters operating in parallel, according to an additional embodiment of the present invention.

FIG. 16 is a diagram of an apparatus for maintaining synchronization between parallel-to-serial converters operating in parallel, according to an additional embodiment of the present invention. The embodiment of the present invention illustrated in FIG. 16 is the same as the embodiment of the present invention illustrated in FIG. 15, except for the difference in the data conversion schemes.

More specifically, referring now to FIG. 16, P/S converters 81 and 82 each include four conversion circuits (not illustrated). Each conversion circuit performs 2:1 parallel-to-serial data format conversion. Therefore, each P/S converter 81 and 82 receives eight inputs and produces four serial outputs. The four serial outputs from P/S converter 81 and the four serial outputs from P/S converter 82 are provided to an 8:1 P/S converter 83 for generating a final serial data output.

P/S converters 81 and 82 each have an internal clock divider (not illustrated) for producing a divided clock signal whose rate is reduced to a half of a received clock rate. The four P/S conversion circuits integrated in P/S converter 81 can operate synchronously by using the divided clock signal of P/S converter 81 as a common timebase. Similarly, the four P/S conversion circuits integrated in P/S converter 82 can operate synchronously by using the divided clock signal of P/S converter 82 as a common timebase. However, the separate S/P converters 81 and 82 require another synchronization mechanism to keep in phase with each other.

Referring to FIG. 16, such a synchronization mechanism is formed by a delay circuit 85, a D-type flip-flop 86, and a delay circuit 87. Moreover, delay circuit 85, D-type flip-flop 86, and delay circuit 87 are exactly the same, and operate the same, as delay circuit 75, D-type flip-flop 76, and delay circuit 77, respectively, in FIG. 15. Therefore, delay circuit 85, D-type flip-flop 86, and delay circuit 87 together form a synchronization control unit 800 which maintains synchronization between P/S converters 81 and 82.

Figure 17:
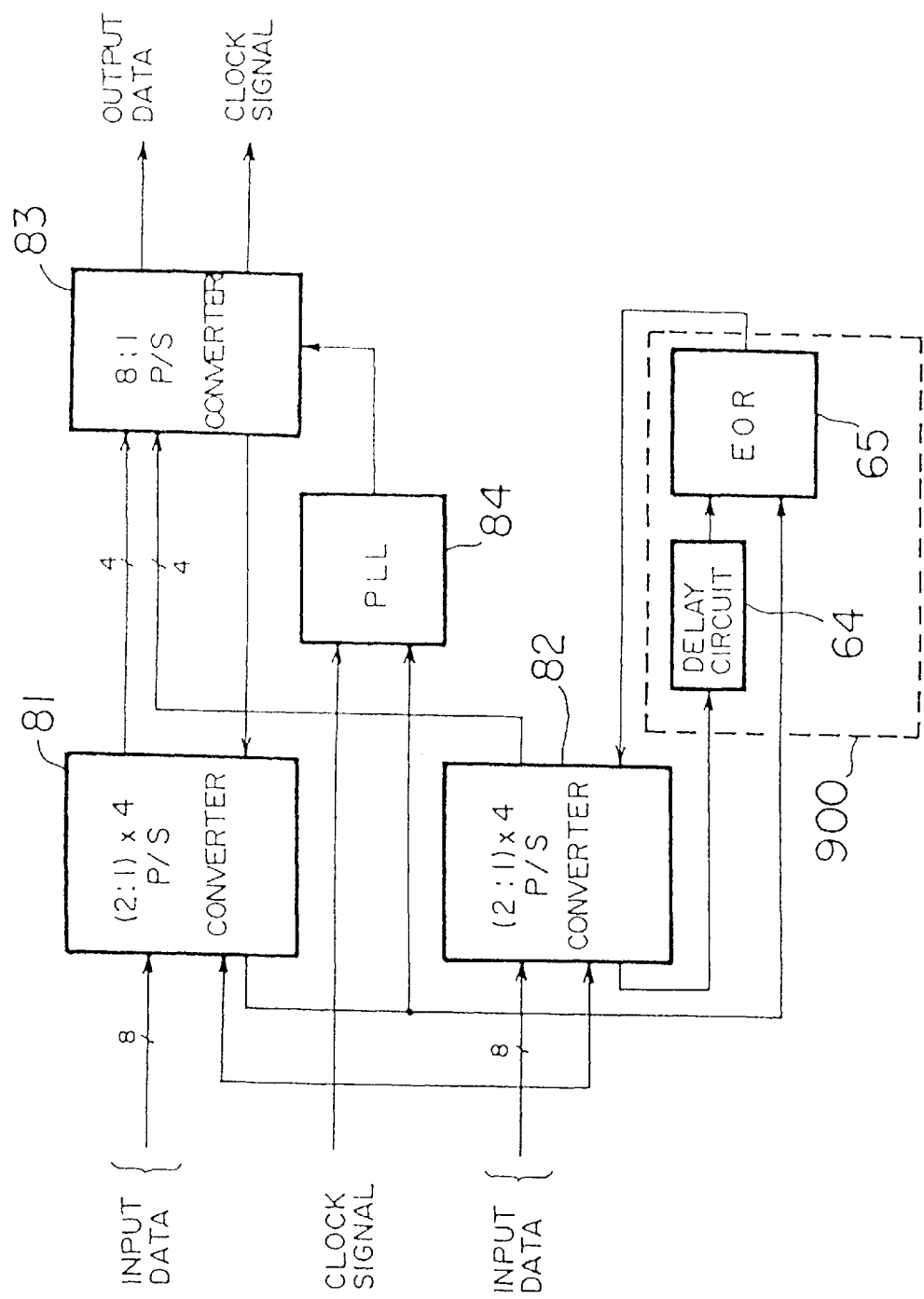
FIG. 17 is a diagram of an apparatus for maintaining synchronization between parallel-to-serial converters operating in parallel, according to a further embodiment of the present invention.

FIG. 17 is a diagram of an apparatus for maintaining synchronization between parallel-to-serial converters operating in parallel, according to a further embodiment of the present invention. The embodiment of the present invention illustrated in FIG. 17 is a combination of the embodiments of the present invention illustrated in FIGS. 14 and 16. Therefore, a repeat description will not be presented here. However, as can be seen from FIG. 17, delay circuit 64 and exclusive OR gate 65 together form a synchronization control unit 900 which maintains synchronization between P/S converters 81 and 82.

According to the above embodiments of the present invention, first and second converters (that is, either S/P converters or P/S converters) produce respectively corresponding first and second clock signals and operate in parallel. The first and second clock signals are in synchronization. A synchronization failure occurs when the first and second clock signals fall out of synchronization. Moreover, when a synchronization failure occurs, a synchronization control unit resets one of the first and second clock signals so that synchronization between the first and second clock signals is restored within a "definite" time period.

A "definite" time period indicates that a converter will be reset within a specific time period. For example, in the above embodiments of the present invention, a converter will definitely be reset upon the occurrence of an edge of the first pulse of a main clock signal occurring after a reset pulse is applied to a converter. For example, as indicated in FIG. 3, a rising edge 18 of the first pulse of the clock signal (b) generated after a reset pulse will cause the converters to be synchronized, thereby guaranteeing that synchronization will be restored within a specific time period. By contrast, as discussed in the Background of the Invention section, a conventional synchronization method which uses an asynchronous reset operation cannot guarantee that synchronization will be restored within a specific or definite time period. Instead, with each successive asynchronous reset operation, the probability increases that the clock dividers will be in phase. Thus, a conventional asynchronous reset operation has a non-deterministic nature.

According to the above embodiments of the present invention, serial-to-parallel converters and parallel-to-serial converters can quickly and reliably recover from a synchronization failure, even while the converters are operating. Moreover, the above embodiments of the present invention will not harm a PLL circuit used in a conversion process.

According to the above embodiments of the present invention, a converter (such as an S/P converter or a P/S converter) has a reset input for receiving a pulse to reset a divided clock signal of the converter. Converters having such a reset input are well-known. Moreover, there are many ways to reset a divided clock signal, and the present invention is not intended to be limited to the use of converters having a built-in reset input or a built-in reset function. For example, external chips or circuits can be provided to reset a divided clock signal.

Various of the above figures illustrate, for example, two S/P converters operating in parallel, or two P/S converters operating in parallel. However, the present invention is not intended to be limited to "two" converters operating in parallel. Instead, the present invention is applicable to a plurality of converters operating in parallel, and only two converters are illustrated in the various figures to simply descriptions. Therefore, for example, FIG. 2 illustrates only two S/P converters; however, the embodiment of the present invention illustrated in FIG. 2 is applicable to a plurality of S/P converters operating in parallel.

According to the above embodiments of the present invention, data streams may be described has having specific data rates. However, the above embodiments of the present invention are not intended to be limited to any specific data rates. Moreover, the above embodiments of the present invention are applicable to many different conversion ratios, and are not intended to be limited to any specific conversion ratios.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. An apparatus comprising:
    first and second serial-to-parallel (S/P) converters which produce respectively corresponding first and second clock signals and operate in parallel, the first and second clock signals being in synchronization and a synchronization failure occurring when the first and second clock signals fall out of synchronization; and
    a synchronization control unit which, when a synchronization failure occurs, resets one of the first and second clock signals, without resetting both of the first and second clock signals, so that synchronization between the first and second clock signals is restored within a definite time period.

2. An apparatus as in claim 1, wherein
    the first and second clock signals are divided clock signals of, and in synchronization with, a main clock signal of a plurality of pulses, and,
    when a synchronization failure occurs due to an error in the second S/P converter, the synchronization control unit causes the second clock signal to be maintained at a constant level for a fixed period of time and, after the fixed period of time, to be synchronized with the main clock signal beginning with an edge of a first pulse of the main clock signal occurring after the fixed period of time.

3. An apparatus as in claim 1, wherein the synchronization control unit comprises:
    a first delay circuit which delays the second clock signal by a first delay time, to produce a delayed clock signal;
    a latching device which latches the delayed clock signal with the first clock signal as a latching trigger, to produce a synchronization failure signal indicating that a synchronization failure has occurred;
    a second delay circuit which delays the synchronization failure signal by a second delay time, to produce a delayed synchronization failure signal; and
    means for resetting the second clock signal with the delayed synchronization failure signal.

4. An apparatus as in claim 3, wherein
    the first and second clock signals are divided clock signals of a main clock signal of a plurality of pulses,
    each pulse of the main clock signal has a cycle time T,
    the first delay time, D1, is in the range of 0<D1<T, and
    the second delay time, D2, is in the range of $(2n-1)T < D2 < 2nT$, where $n = (1, 2, 3, \ldots)$.

5. An apparatus as in claim 3, wherein
    a synchronization failure occurs due to an error in the second S/P converter,
    the first and second clock signals are divided clock signals of, and in synchronization with, a main clock signal of a plurality of pulses, and
    the means for resetting, when a synchronization failure occurs, causes the second clock signal to be maintained at a constant level for a fixed period of time and, after the fixed period of time, to be synchronized with the main clock signal beginning with an edge of a first pulse of the main clock signal occurring after the fixed period of time.

6. An apparatus as in claim 3, wherein the latching device is a D-type flip flop having a data (D) input and a clock (C) input, the delayed clock signal being received in the D input and the first clock signal being received in the C input.

7. An apparatus as in claim 1, wherein the synchronization control unit comprises:
    a first delay circuit which delays the second clock signal by a first delay time, to produce a delayed clock signal;
    a logical OR circuit which performs a logical OR operation of the second clock signal and the delayed clock signal, to produce a logical OR result signal;

a second delay circuit which delays the logical OR result signal by a second delay time;

a latching device which latches the delayed logical OR result signal with the first clock signal as a latching trigger, to produce a synchronization failure signal indicating that a synchronization failure has occurred;

a third delay circuit which delays the synchronization failure signal by a third delay time, to produce a delayed synchronization failure signal; and means for resetting the second clock signal with the delayed synchronization failure signal.

8. An apparatus as in claim 7, wherein the first and second clock signals are divided clock signals of a main clock signal of a plurality of pulses, each pulse of the main clock signal has a cycle time T, the first delay time, D1, is set to be approximately equal to T, the second delay time, D2, is set to be approximately equal to $(4+1/2)T$, and the third delay time, D3, is in the range of $(4n-1)T<D3<4nT$, where $n=(1, 2, 3 \ldots )$.

9. An apparatus as in claim 1, wherein the first S/P converter receives a respective clock signal and the first clock signal produced by the first S/P converter is a divided clock signal of the received clock signal, the second S/P converter receives a respective clock signal and the second clock signal produced by the second S/P converter is a divided clock signal of the received clock signal, the clock signal received by the second S/P converter being a separate clock signal from the clock signal received by the first S/P converter, and the synchronization control unit comprises a delay circuit which delays the second clock signal by a delay time, to produce a delayed clock signal, and an exclusive OR circuit which performs an exclusive OR operation of the delayed clock signal and the first clock signal, to produce an exclusive OR result signal which is supplied to the second S/P converter as the clock signal received by the second S/P converter.

10. An apparatus comprising:

first and second parallel-to-serial (P/S) converters which produce respectively corresponding first and second clock signals and operate in parallel, the first and second clock signals being in synchronization and a synchronization failure occurring when the first and second clock signals fall out of synchronization; and a synchronization control unit which, when a synchronization failure occurs, resets one of the first and second clock signals, without resetting both of the first and second clock signals, so that synchronization between the first and second clock signals is restored within a definite time period.

11. An apparatus as in claim 10, wherein the first and second clock signals are divided clock signals of, and in synchronization with, a main clock signal of a plurality of pulses, and, when a synchronization failure occurs due to an error in the second P/S converter, the synchronization control unit causes the second clock signal to be maintained at a constant level for a fixed period of time and, after the fixed period of time, to be synchronized with the main clock signal beginning with an edge of a first pulse of the main clock signal occurring after the fixed period of time.

12. An apparatus as in claim 10, wherein the synchronization control unit comprises:

a first delay circuit which delays the second clock signal by a first delay time, to produce a delayed clock signal;

a latching device which latches the delayed clock signal with the first clock signal as a latching trigger, to produce a synchronization failure signal indicating that a synchronization failure has occurred;

a second delay circuit which delays the synchronization failure signal by a second delay time, to produce a delayed synchronization failure signal; and means for resetting the second clock signal with the delayed synchronization failure signal.

13. An apparatus as in claim 12, wherein the first and second clock signals are divided clock signals of a main clock signal of a plurality of pulses, each pulse of the main clock signal has a cycle time T, the first delay time, D1, is in the range of $0<D1<T$, and the second delay time, D2, is in the range of $(2n-1)T<D2<2nT$, where $n=(1, 2, 3, \ldots )$.

14. An apparatus as in claim 12, wherein the first and second clock signals are divided clock signals of a main clock signal, the apparatus further comprising:

a phase-locked loop circuit which receives an external clock signal and the first clock signal and, with reference to the phases of the external clock signal and the first clock signal, generates a synchronizing clock signal for use in generating the main clock signal.

15. An apparatus as in claim 10, wherein the first P/S converter receives a respective clock signal and the first clock signal produced by the first P/S converter is a divided clock signal of the received clock signal, the second P/S converter receives a respective clock signal and the second clock signal produced by the second P/S converter is a divided clock signal of the received clock signal, the clock signal received by the second P/S converter being a separate clock signal from the clock signal received by the first P/S converter, and the synchronization control unit comprises a delay circuit which delays the second clock signal by a delay time, to produce a delayed clock signal, and an exclusive OR circuit which performs an exclusive OR operation of the delayed clock signal and the first clock signal, to produce an exclusive OR result signal which is supplied to the second P/S converter as the clock signal received by the second P/S converter.

16. An apparatus as in claim 10, wherein the first P/S converter receives a respective clock signal and the first clock signal produced by the first P/S converter is a divided clock signal of the received clock signal, the second P/S converter receives a respective clock signal and the second clock signal produced by the second P/S converter is a divided clock signal of the received clock signal, the clock signal received by the second P/S converter being a separate clock signal from the clock signal received by the first P/S converter, the apparatus further comprising a phase-locked loop circuit which receives an external clock signal and the first clock signal and, with reference to the phases of the external clock signal and the first clock signal, generates a synchronizing clock signal for use in generating the clock signal received by the first P/S converter.

17. An apparatus comprising:

first and second serial-to-parallel (S/P) converters which produce respectively corresponding first and second divided clock signals of, and in synchronization with, a main clock signal of a plurality of pulses, the first and second divided clock signals thereby being in synchronization with each other and a synchronization failure occurring when the first and second divided clock signals fall out of synchronization due to an error in the second S/P converter; and a synchronization control unit which, when a synchronization failure occurs, causes the second divided clock signal to be maintained at a constant level for a fixed period of time and, after the fixed period of time, to be synchronized with the main clock signal beginning with an edge of a first pulse of the main clock signal occurring after the fixed period of time.

18. An apparatus as in claim 17, wherein the synchronization control unit comprises:

a first delay circuit which delays the second divided clock signal by a first delay time, to produce a delayed clock signal;

a latching device which latches the delayed clock signal with the first divided clock signal as a latching trigger, to produce a synchronization failure signal indicating that a synchronization failure has occurred;

a second delay circuit which delays the synchronization failure signal by a second delay time, to produce a delayed synchronization failure signal; and means for using the delayed synchronization failure signal to maintain the second divided clock signal at a constant level for a fixed period of time and, after the fixed period of time, to be synchronized with the main clock signal.

19. An apparatus as in claim 18, wherein each pulse of the main clock signal has a cycle time T, the first delay time, D1, is in the range of 0<D1<T, and the second delay time, D2, is in the range of $(2n-1)T<D2<2nT$, where $n=(1, 2, 3, \ldots)$.

20. An apparatus as in claim 18, wherein the latching device is a D-type flip flop having a data (D) input and a clock (C) input, the delayed clock signal being received in the D input and the first divided clock signal being received in the C input.

21. An apparatus as in claim 17, wherein the synchronization control unit comprises:

a first delay circuit which delays the second divided clock signal by a first delay time, to produce a delayed clock signal;

a logical OR circuit which performs a logical OR operation of the second divided clock signal and the delayed clock signal, to produce a logical OR result signal;

a second delay circuit which delays the logical OR result signal by a second delay time;

a latching device which latches the delayed logical OR result signal with the first divided clock signal as a latching trigger, to produce a synchronization failure signal indicating that a synchronization failure has occurred;

a third delay circuit which delays the synchronization failure signal by a third delay time, to produce a delayed synchronization failure signal; and means for using the delayed synchronization failure signal to maintain the second divided clock signal at a constant level for a fixed period of time and, after the fixed period of time, to be synchronized with the main clock signal.

22. An apparatus as in claim 21, wherein each pulse of the main clock signal has a cycle time T, the first delay time, D1, is set to be approximately equal to T, the second delay time, D2, is set to be approximately equal to $(4+1/2)T$, and the third delay time, D3, is in the range of $(4n-1)T<D3<4nT$, where $n=(1, 2, 3 \ldots)$.

23. An apparatus comprising:

first and second parallel-to-serial (P/S) converters which produce respectively corresponding first and second divided clock signals of, and in synchronization with, a main clock signal of a plurality of pulses, the first and second divided clock signals thereby being in synchronization with each other and a synchronization failure occurring when the first and second divided clock signals fall out of synchronization due to an error in the second P/S converter; and a synchronization control unit which, when a synchronization failure occurs, causes the second divided clock signal to be maintained at a constant level for a fixed period of time and, after the fixed period of time, to be synchronized with the main clock signal beginning with an edge of a first pulse of the main clock signal occurring after the fixed period of time.

24. An apparatus as in claim 23, wherein the synchronization control unit comprises:

a first delay circuit which delays the second divided clock signal by a first delay time, to produce a delayed clock signal;

a latching device which latches the delayed clock signal with the first divided clock signal as a latching trigger, to produce a synchronization failure signal indicating that a synchronization failure has occurred;

a second delay circuit which delays the synchronization failure signal by a second delay time, to produce a delayed synchronization failure signal; and means for using the delayed synchronization failure signal to maintain the second divided clock signal at a constant level for a fixed period of time and, after the fixed period of time, to be synchronized with the main clock signal.

25. An apparatus as in claim 24, wherein each pulse of the main clock signal has a cycle time T, the first delay time, D1, is in the range of 0<D1<T, and the second delay time, D2, is in the range of $(2n-1)T<D2<2nT$, where $n=(1, 2, 3, \ldots)$.

26. An apparatus as in claim 23, further comprising:

a phase-locked loop circuit which receives an external clock signal and the first divided clock signal and, with reference to the phases of the external clock signal and the first divided clock signal, generates a synchronizing clock signal for use in generating the main clock signal.

* * * * *